United States Patent [19]

Hori et al.

[11] Patent Number: 5,445,710

[45] Date of Patent: * Aug. 29, 1995

[54] METHOD OF MANUFACTURING SEMICONDUCTOR DEVICE

[75] Inventors: Masaru Hori, Aichi; Hiroyuki Yano, Yokohama; Keiji Horioka, Kawasaki; Hisataka Hayashi, Urayasu; Sadayuki Jimbo, Yokohama; Haruo Okano; Kazuhiro Tomioka, both of Tokyo; Yasuhiro Ito; Haruki Mori, both of Yokohama, all of Japan

[73] Assignee: Kabushiki Kaisha Toshiba, Kawasaki, Japan

[*] Notice: The portion of the term of this patent subsequent to Apr. 12, 2011 has been disclaimed.

[21] Appl. No.: 202,372

[22] Filed: Feb. 25, 1994

Related U.S. Application Data

[63] Continuation of Ser. No. 20,193, Feb. 19, 1993, Pat. No. 5,302,240, which is a continuation-in-part of Ser. No. 824,095, Jan. 22, 1992, Pat. No. 5,240,554.

[30] Foreign Application Priority Data

| | | | |
|---|---|---|---|
| Jan. 22, 1991 | [JP] | Japan | 3-21569 |
| Jul. 30, 1991 | [JP] | Japan | 3-211302 |
| Jan. 13, 1992 | [JP] | Japan | 4-4197 |
| Jan. 13, 1992 | [JP] | Japan | 4-4198 |
| Feb. 19, 1992 | [JP] | Japan | 4-32060 |
| Jul. 17, 1992 | [JP] | Japan | 4-191076 |

[51] Int. Cl.⁶ .................. H01L 21/306; C03C 15/00; B44C 1/22; C23F 1/00

[52] U.S. Cl. .................. 156/643.1; 252/79.1; 437/228

[58] Field of Search ............... 156/643, 652, 657, 656, 156/654, 659.1, 661.1, 904, 662; 252/79.1; 204/192.32, 192.35, 192.37; 437/228, 238, 245

[56] References Cited

U.S. PATENT DOCUMENTS

| | | | |
|---|---|---|---|
| 4,620,898 | 11/1986 | Banks et al. | 156/643 |
| 4,704,342 | 11/1987 | Lehrer | 430/5 |
| 4,820,611 | 4/1989 | Arnold et al. | 430/271 |
| 4,904,338 | 2/1990 | Kozicki | 156/628 |
| 4,975,144 | 12/1990 | Yamazaki et al. | 156/643 |
| 5,022,959 | 6/1991 | Itoh et al. | 156/643 |
| 5,102,498 | 4/1992 | Itoh et al. | 156/659.1 |
| 5,240,554 | 8/1993 | Hori et al. | 156/643 |
| 5,302,240 | 4/1994 | Hori et al. | 156/643 |

FOREIGN PATENT DOCUMENTS

| | | |
|---|---|---|
| 0285129 | 10/1988 | European Pat. Off. . |
| 3428565 | 3/1985 | Germany . |
| 235010 | 4/1986 | Germany . |
| 3821614 | 12/1989 | Germany . |
| 58-94078 | 6/1983 | Japan . |
| 58-212136 | 12/1983 | Japan . |
| 60-119731 | 6/1985 | Japan . |
| 60-235426 | 11/1985 | Japan . |
| 62-136025 | 6/1987 | Japan . |
| 62-136820 | 6/1987 | Japan . |
| 63-76438 | 4/1988 | Japan . |
| 60-117723 | 6/1993 | Japan . |
| 1439153 | 6/1976 | United Kingdom . |
| 2129217 | 5/1984 | United Kingdom . |

OTHER PUBLICATIONS

J. Electrochem. Soc.; vol. 136, No. 4; Apr. 1989; pp. 1181–1185; T. R. Pampalone, et al.; "Improved Photoresist Patterning Over Reflective Topographies Using Titanium Oxynitride Antireflection Coatings".

(List continued on next page.)

*Primary Examiner*—William Powell
*Attorney, Agent, or Firm*—Oblon, Spivak, McClelland, Maier & Neustadt

[57] ABSTRACT

A dry-etching method comprising the steps of forming carbon film on a substrate to be etched, forming a resist pattern on said carbon thin film, selectively etching said carbon film using said resist pattern as a mask by a plasma of a gas mixture of a gas containing fluorine atoms and a gas containing oxygen atoms which are mixed at an atomic ratio of fluorine to oxygen of 198:1 to 1:2 so as to form a carbon film pattern, and selectively etching said substrate to be etched using said carbon film pattern as a mask or said resist pattern and said carbon film pattern as masks.

18 Claims, 29 Drawing Sheets

OTHER PUBLICATIONS

J. Appl. Phys.; vol. 60, No. 3; Mar. 1979; pp. 1212–1214; H. A. M. Van Den Berg, et al.; "Antireflection Coatings on Metal Layers for Photolithographic Purposes".

Fiz Technik Datenbank Frankfurt; Abstract AN 2605230; "Hard Carbon Coatings for IR Optical and Heavy Duty Applications".

Journal of Technical Disclosure; No. 78-2427, vol. 3-12; 1978.12.20.

Solid State Technology; Apr. 1985; pp. 243–246; M. L. Hill, et al; "Advantages of Magnetron Etching".

Japanese Journal of Applied Physics; vol. 29, No. 10; Oct. 1990; pp. 2229–2235; K. Ono, et al.; "Plasma Chemical View of Magnetron and Reactive Ion Etching of Si with CL2".

Solid State Technology; Feb. 1988; pp. 67–71; R. R. Burke, et al.; "Microwave Multipolar Plasma for Etching and Deposition".

IBM Technical Disclosure Bulletin; vol. 30, No. 10; Mar. 1988; pp. 402–406; "Carbonized Resist as Directly-Patternable Mask Absorber".

J. Vac. Sci. Technol. B6(6); Nov./Dec. 1988; pp. 1626–1631; Jin-Zhong Yu; "High-Rate Ion Etching of GaAs and Si at Low Ion Energy By Using An Electron Beam Excited Plasma System".

J. Vac. Sci. Technol. B6(1); Jan./Feb. 1988; pp. 284–287; R. Lossy, et al; "Characterization of a Reactive Broad Beam Radio-Frequency Ion Source".

Japanese Journal of Applied Physics; vol. 28, No. 11; Nov. 1989; pp. 2363–2367; S. Noda et al.; "MOS Gate Etching Using an Advanced Magnetron Etching System".

Appl. Phys. Lett. 55(2); Jul. 10, 1989; pp. 148–150; A. J. Perry, et al; "Fast Anisotropic Etching of Silicon in an Inductively Coupled Plasma Reactor".

Toshiba Review No. 143; Spring 1983; pp. 31–35; H. Ohano, et al.; "High-Rate Reactive Ion Etching Technology".

1990 Dry Process Symposium; pp. 105–109, 1990, T. Ohiwa, et al., "$SiO_2$ Tapered Etching Employing Magnetron Discharge".

J. Appl. Phys. 65(2); Jan. 15, 1989; pp. 464–467; M. J. Cooke; "Anisotropy Control in $CF_4$ Microwave Plasma Etching".

IBM Technical Disclosure Bulletin; vol. 27, No. 7A; Dec. 1984; p. 4102; K. L. Holland, et al; "Polyimide Adhesion to Pre-Treated Silicon Nitride Surfaces".

J. Vac. Sci. Technol. A4(3); May/Jun. 1986; pp. 698–699; V. Vukanovic, et al; "Summary Abstract: Polyimide Etching and Passivation Downstream of an 02-CF4-AR Microwave Plasma".

"Webster's II New Riverside University Dictionary"; C. 184; Hougton Mifflin Co.; Boston, Mass.; p. 970.

Japan Institute of Invention and Innovation, Journal of Technical Disclosure No. 78-2427.

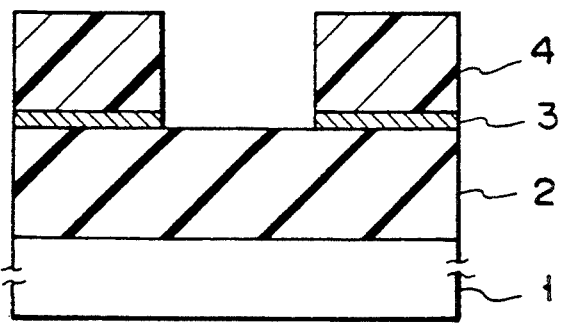
F I G. 1 A
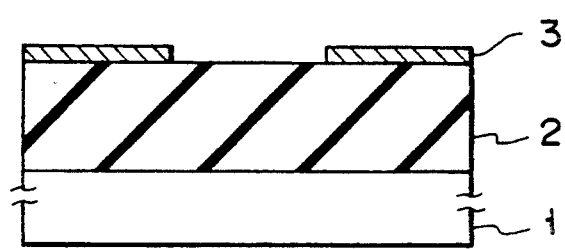
F I G. 1 B
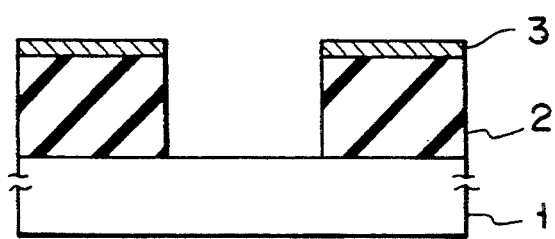
F I G. 1 C
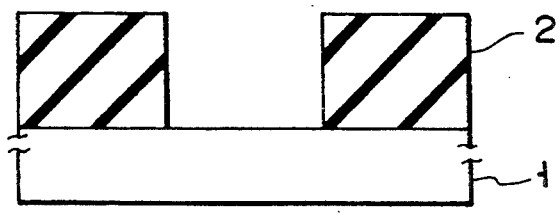
F I G. 1 D

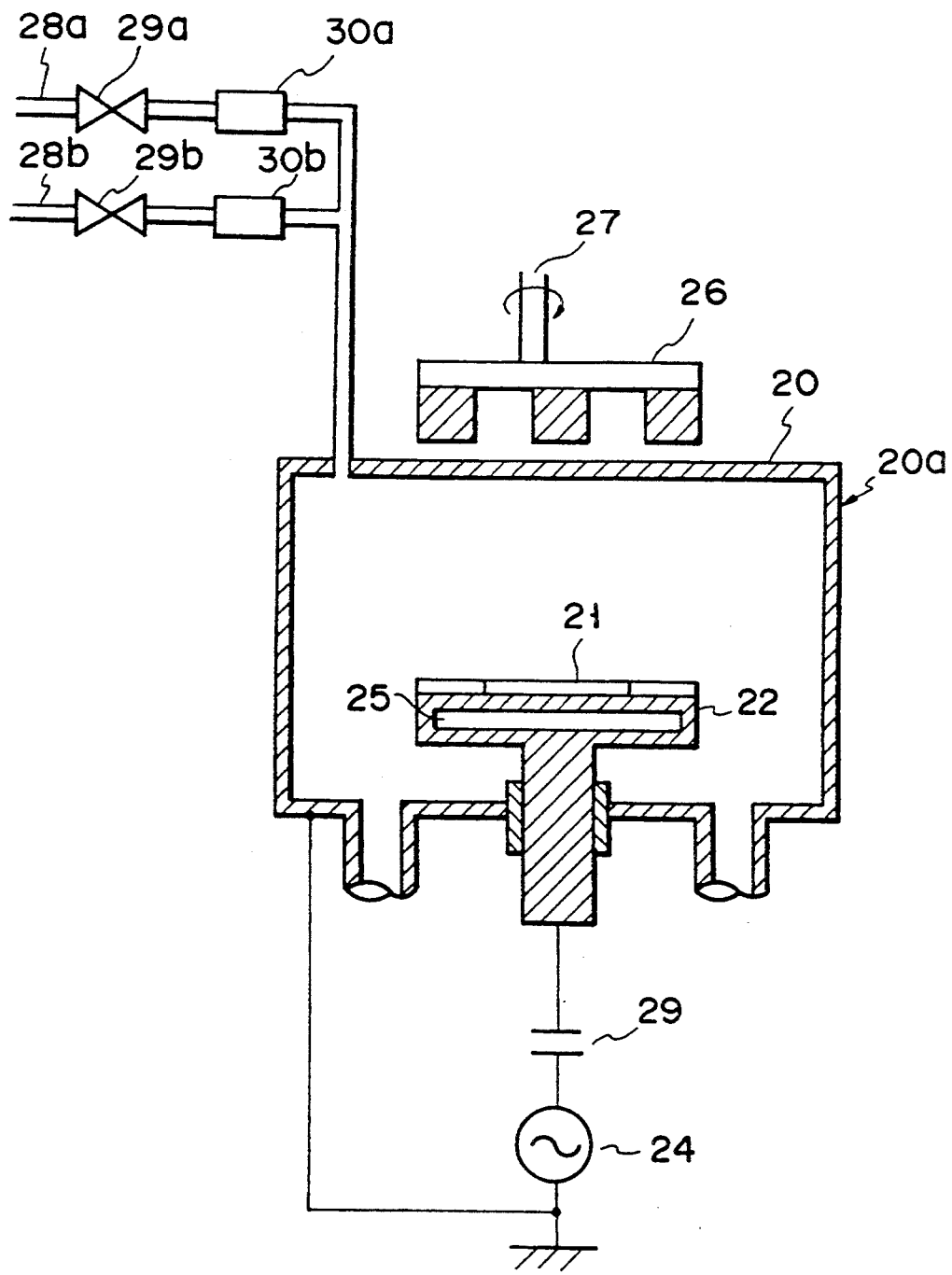
F I G. 2

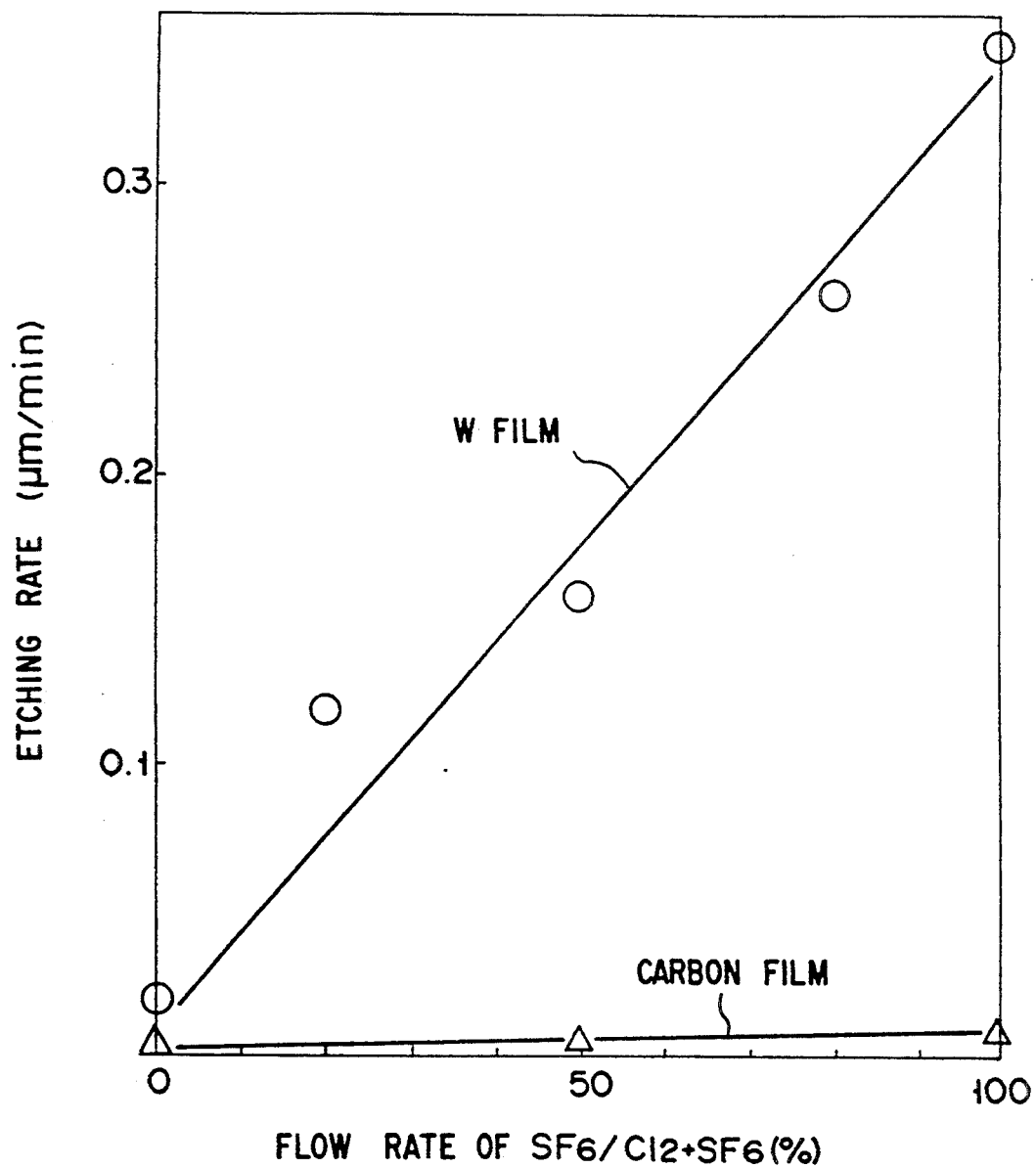
F I G. 6

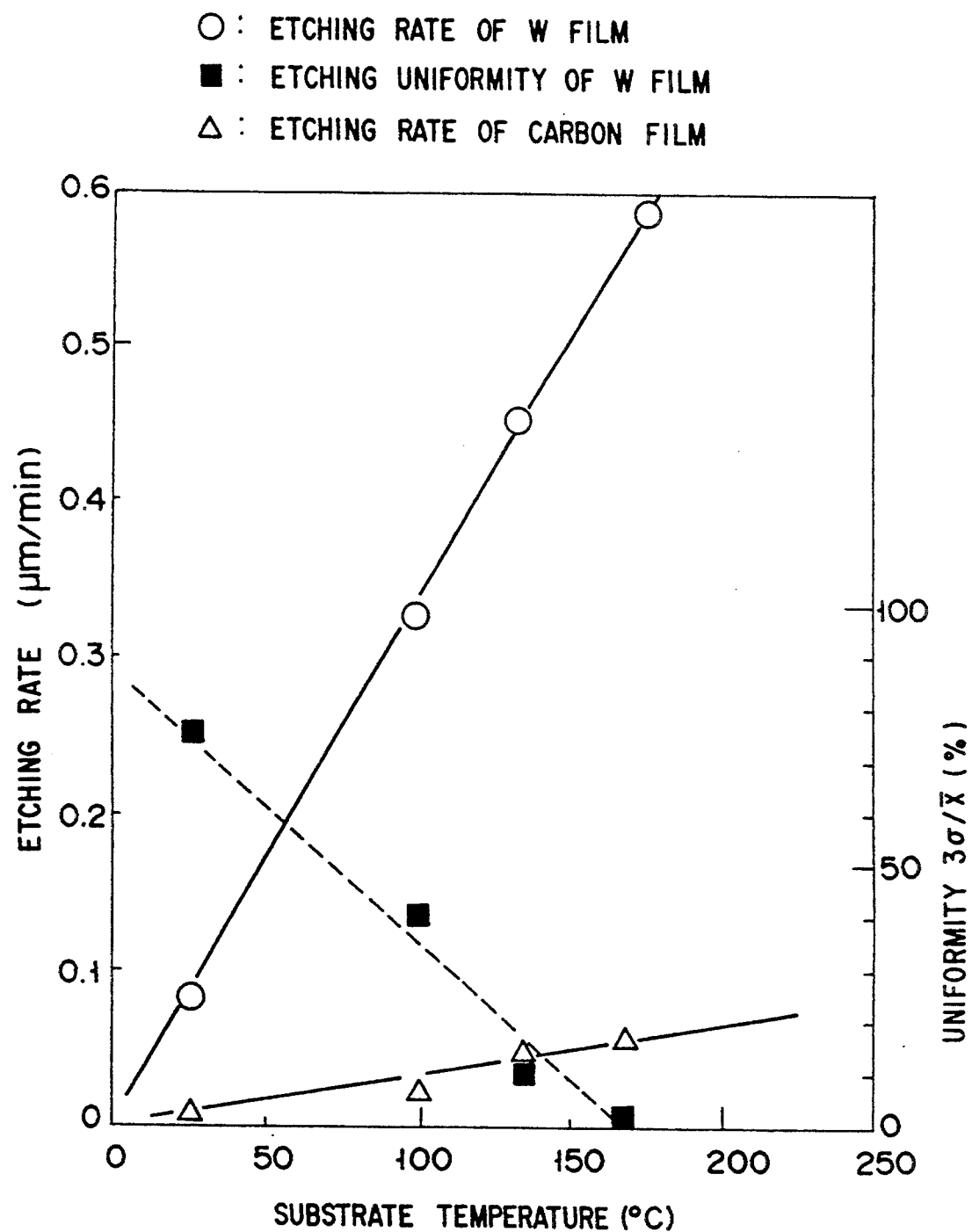
F I G. 8

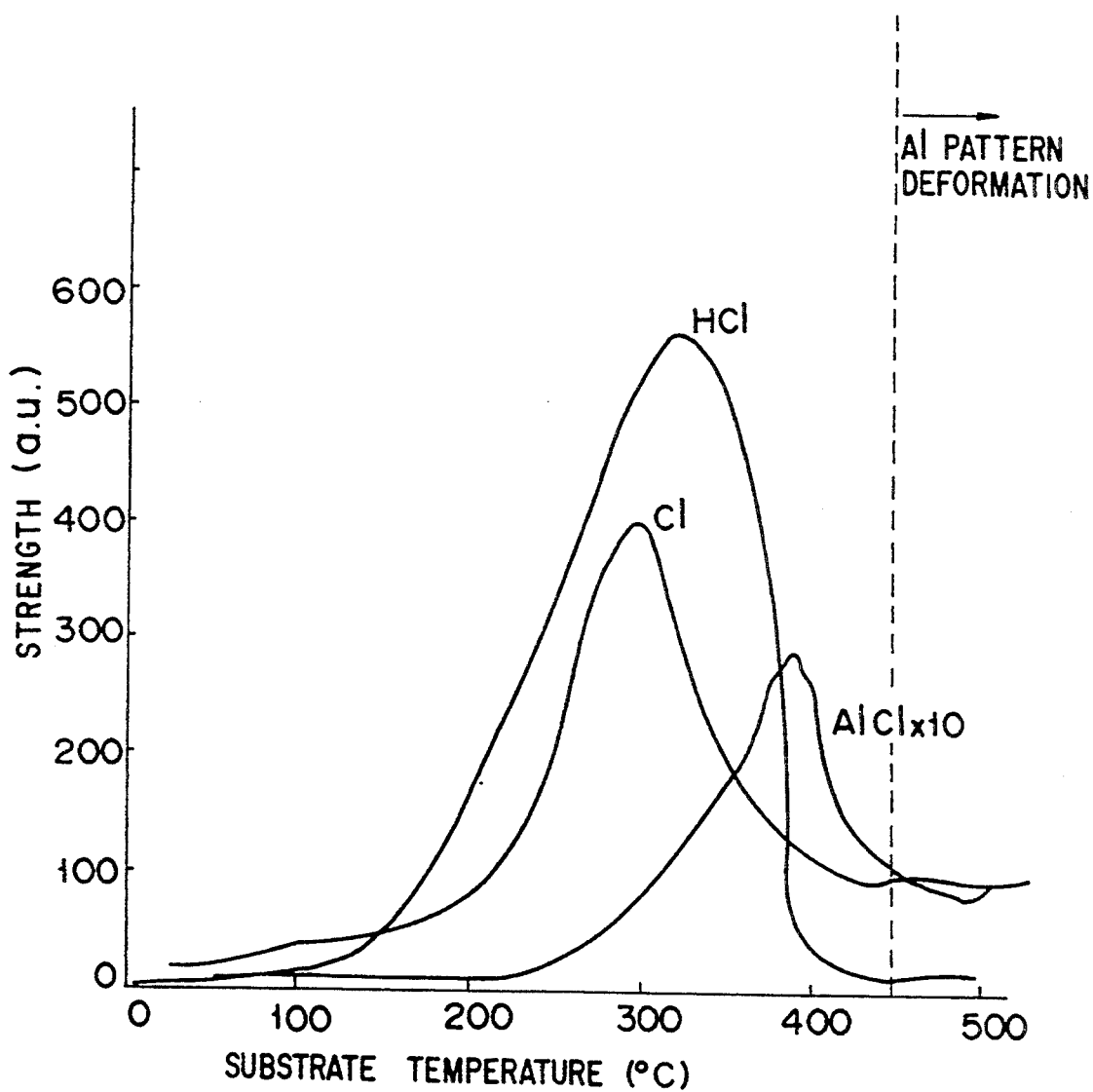
F I G. 10

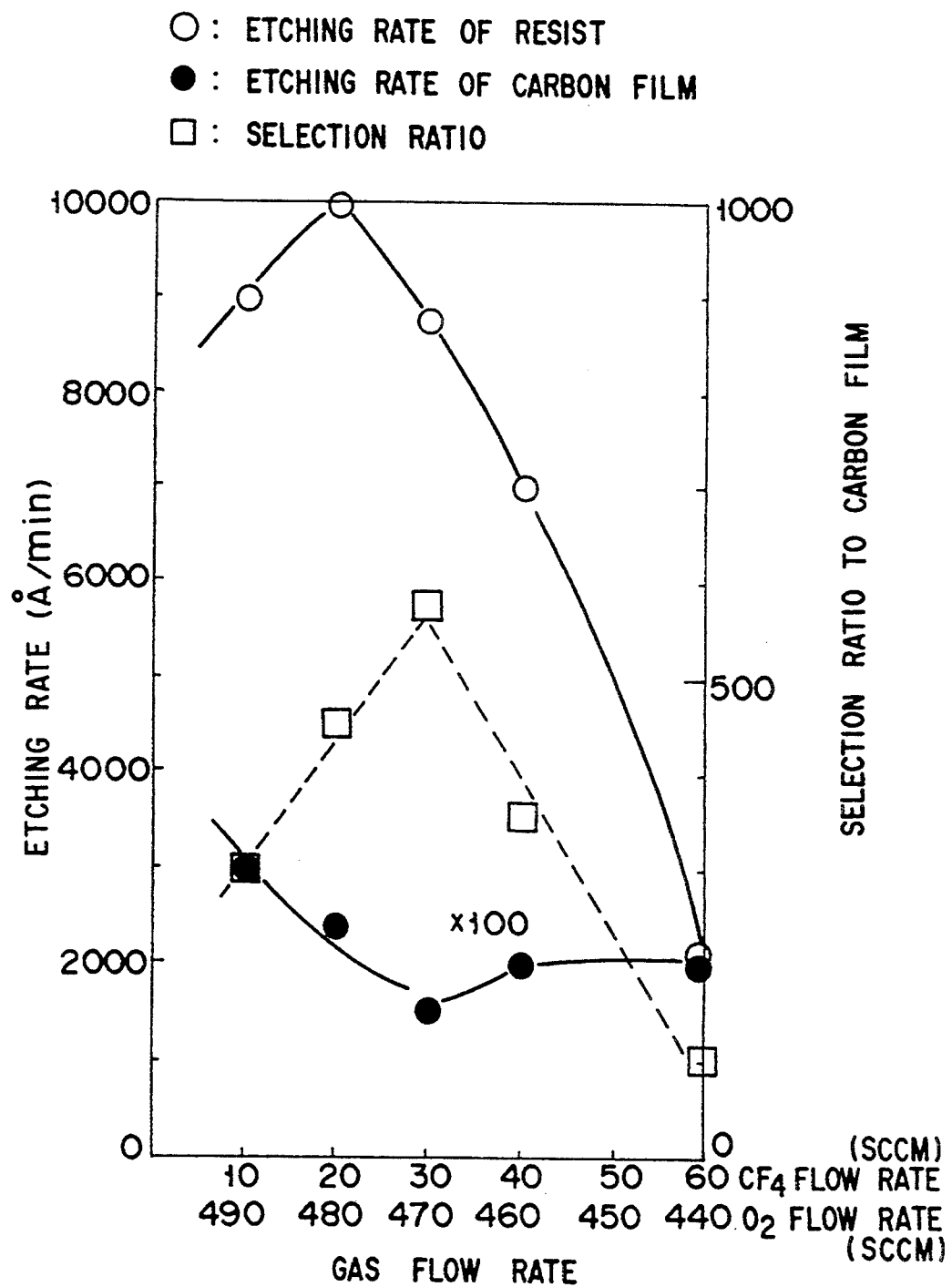
F I G. 16

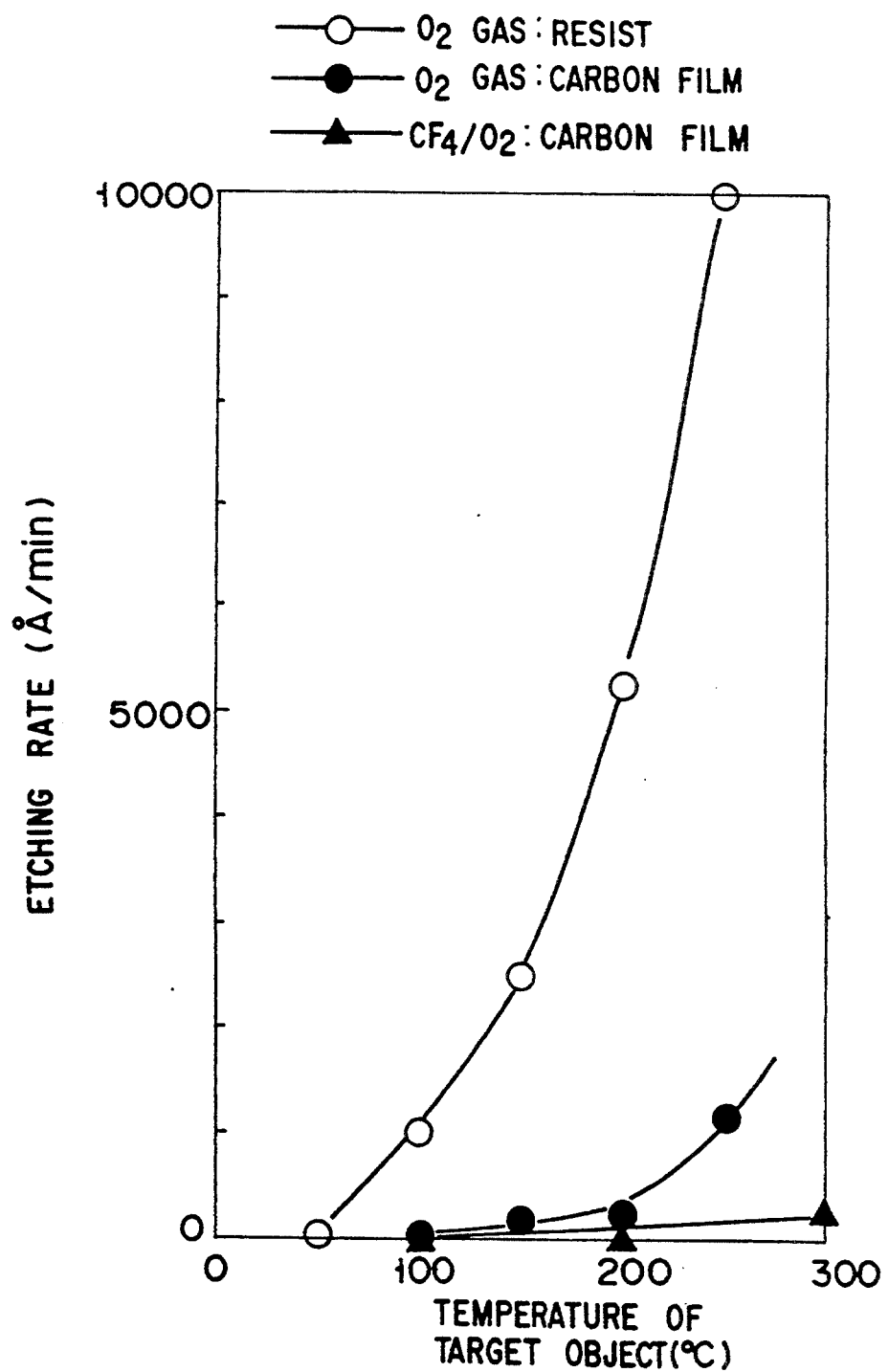
F I G. 17

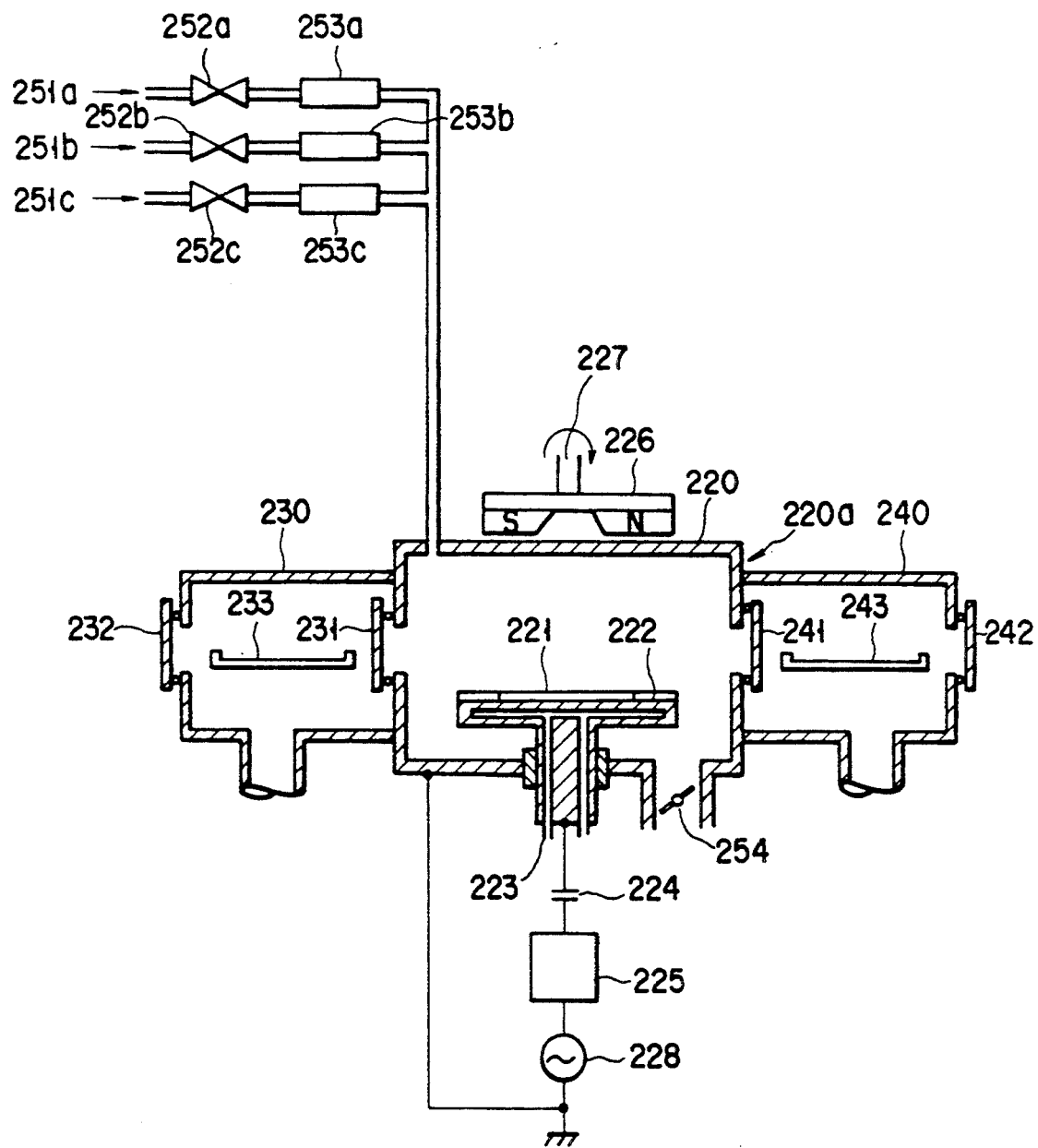
F I G. 20

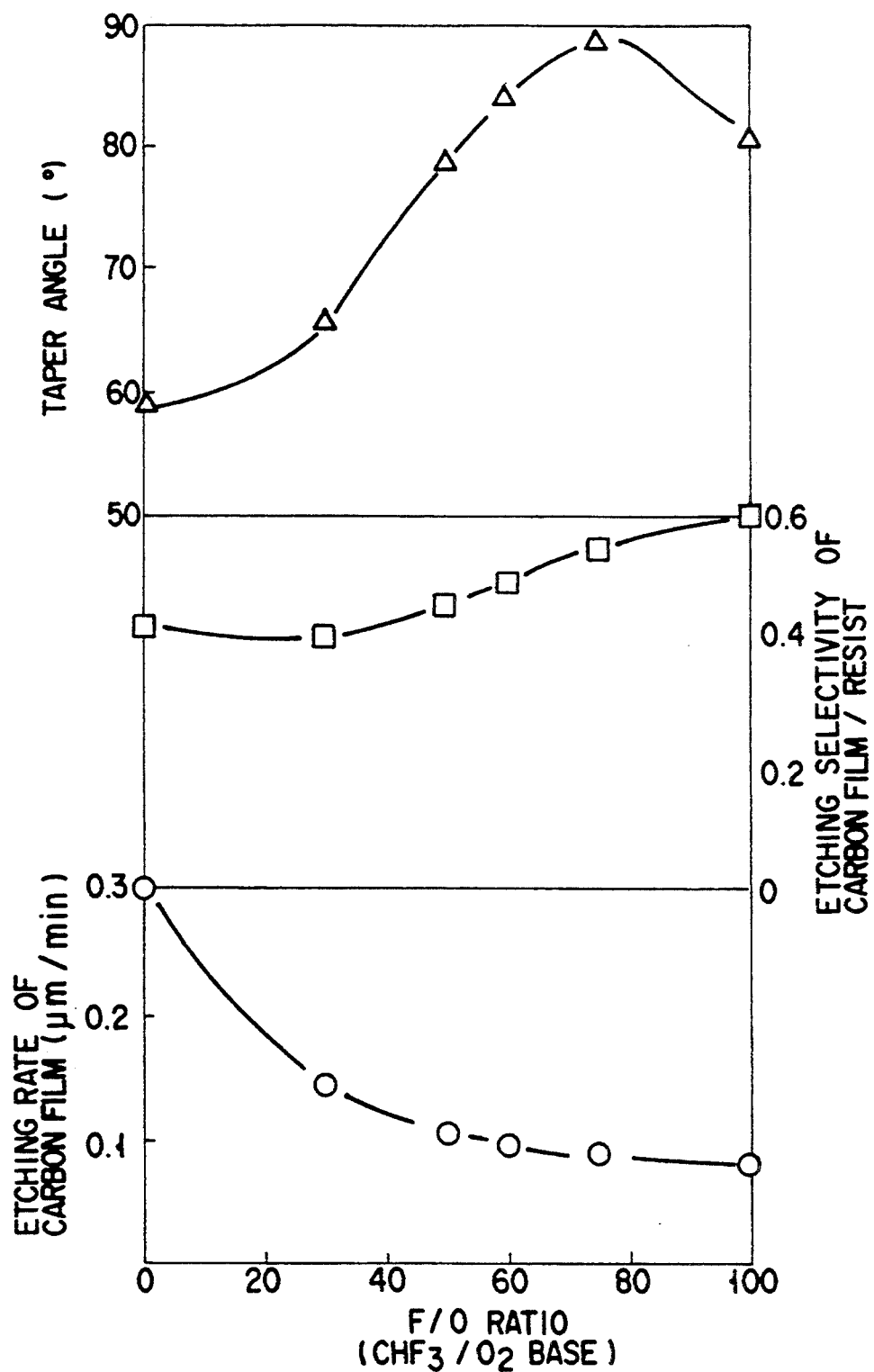
F I G. 23

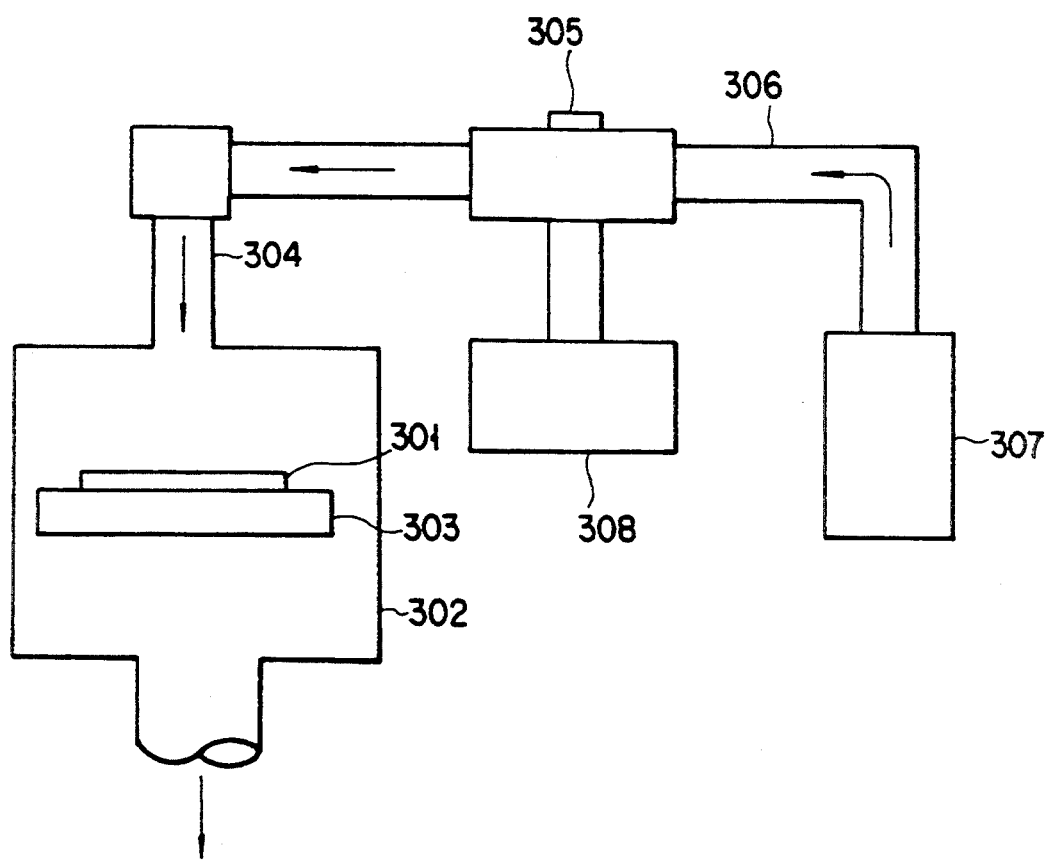
F I G. 25

METHOD OF MANUFACTURING SEMICONDUCTOR DEVICE

CROSS-REFERENCES TO THE RELATED APPLICATIONS

This is a continuation of application Ser. No. 08/020,193, filed on Feb. 19, 1993, now U.S. Pat. No. 5,302,240, which is a CIP of 07/824,095 filed Jan. 22, 1992, now U.S. Pat. No. 5,240,554.

This application is a continuation-in-part of U.S. patent application Ser. No. 824,095, filed on Jan. 22, 1992.

BACKGROUND OF THE INVENTION

The present invention relates to a method of manufacturing a semiconductor device and, more particularly, to a method of manufacturing a semiconductor device having an improved dry etching step.

2. DESCRIPTION OF THE RELATED ART

In recent years, micropatterning of an element has advanced in accordance with the progress of the technique of a semiconductor integrated circuit, pattern dimensions having high accuracy has been demanded. A semiconductor integrated circuit can be generally obtained by stacking an insulating thin film such as a silicon oxide film having a predetermined pattern and a conductive thin film such as a polysilicon, aluminum, copper, tungsten, or silicide film on a semiconductor substrate such as a silicon substrate.

As techniques for processing the film film into a predetermined pattern, lithographic, dry etching, and removing techniques are used. In the lithographic technique, after a photosensitive resist is coated on the thin film, the resist is exposed to a light beam or an ultraviolet beam in accordance with the predetermined pattern, and an exposed portion or non-exposed portion is selectively removed by development to form a resist pattern. In the dry etching technique, the underlying thin film is etched using the resist pattern as a mask. In the removing technique, the resist is removed.

However, as a degree of, integration of semiconductor elements is increased, the required minimum size becomes small and dimensional precision of a pattern becomes more strict. Recently, a micropattern having a size of 0.5 μm or less has been required. In order to cope with the above pattern in a small region, since the above techniques for forming a pattern have various problems, the techniques must be largely improved.

These problems are described below in detail.

As one method of processing an underlying thin film using a small resist pattern, an RIE method using a plasma is popularly used. According to this method, a substrate on which a target film is deposited is loaded in a vacuum vessel having a pair of parallel plate electrodes, and after the vessel is evacuated, a reactive gas having a halogen element or the like is supplied into the vessel. A plasma is produced by the gas using discharging caused by application of an RF power, and the target film is etched by the produced plasma.

According to this etching method, ions of various particles in the plasma are accelerated by a DC electric field generated at an ion sheath on the surfaces of the electrodes, and the ions having high energy are collided with the target film, thereby performing an ion-assisted chemical reaction. For this reason, etching is performed in the direction of the incident ions, and directional etching having no undercut can be performed.

Since all materials are excited or activated by this ion collision, differences between reactivities unique to materials cannot be easily obtained in this etching compared with etching using only radicals, and a ratio of etching rates of different materials, i.e., a selection ratio is generally low. For example, since an etching rate of a resist is high with respect to Al, it is difficult to form a pattern with high accuracy due to a large pattern conversion difference. In addition, since the thickness of a resist is small at a stepped portion, a wiring portion is disadvantageously etched to disconnect wiring lines.

In etching of a silicon oxide film, it has a low selection ratio of the silicon oxide film to an underlying material. That is, since underlying silicon (Si) or aluminum (Al) has a high etching rate, etching cannot be immediately stopped with high precision when the surface of the underlying material is exposed. For this reason, when contact holes having different depths are to be formed by etching, silicon or aluminum serving as the underlying layer at the bottom of a shallow hole is undesirably etched in a considerable amount, thereby degrading device characteristics.

In such dry etching, since the moving directions of radicals are not aligned with each other, an increase in etching rate ratio (selectivity) of a film to be etched to a mask at a desired constant etching rate of the film to be etched makes it impossible to form a highly precise pattern due to undesirable side-etching or deposition of the resultant pattern.

Anisotropic etching free from side-etching, an increase in etching rate ratio (selectivity) of the film to be etched to the mask, and a high etching rate of the film to be etched have a trade-off relationship. That is, it is difficult to simultaneously satisfy these three conditions.

In recent years, a mechanism for maintaining and controlling a wafer temperature to a low temperature of 0° C. or less during etching is employed. Etching can be performed at a high etching rate by an ion-assisted reaction in a direction of a depth, and anisotropic etching can be performed in a lateral direction while the reaction is "frozen". Low-temperature wafer control allows control of a reaction on side walls of a pattern, so that the pattern shape can be controlled. For example, in etching of a silicon oxide film ($SiO_2$), Oiwa (Dry Process Symposium P. 105; 1990) proposed etching of a tapered silicon oxide film ($SiO_2$) within an appropriate range between the pressure and the substrate temperature.

Technical specifications required for contact hole along with an increase in integration of semiconductor elements are a decrease in hole diameter and an increase in hole depth. When the hole diameter is decreased and the hole depth is increased, the diameter of the bottom of the hole can be made smaller than that defined in the device specifications because the side wall of the contact hole is tapered. A contact hole is a hole for electrically connecting underlying silicon and a wiring layer formed on the silicon oxide film. For this purpose, a metal (e.g., aluminum or tungsten) or polysilicon is buried in the contact hole. It is thus known that a more perfect electrical connection can be achieved when a contact area between the metal or polysilicon to be buried and the underlying silicon is increased. In view of improvement of electrical characteristics and an increase in integration density, the side wall of the contact hole must be vertical. That is, the specifications required for forming a contact hole used in a highly integrated device are a high selection ratio (at least 20) to silicon and a vertical side wall.

In a silicon oxide film, although it is possible to form a vertical side wall of a contact hole at a high selection ratio to silicon and a high substrate temperature, a resist pattern is thermally deformed at a substrate temperature of 160° C. or more. Therefore, the upper limit of the taper angle of the side wall of the pattern is 83° C. It is therefore impossible to obtain a desired pattern with high precision. In ion milling of Al, Au, or Pt, since high-energy particles bombard against the substrate, the temperature of the substrate is increased during etching. The resist pattern is thermally deformed to disable high-precision etching.

Use of a silicon oxide or nitride film as a heat-resistant mask to etch copper or the like at high temperatures is reported. In this case, since copper tends to be oxidized at high temperatures, a residue may be produced, the shape is deformed, or diffusion of copper into the mask material occurs. Therefore, the electrical characteristics are degraded, and it is impossible to form a good wiring layer.

In etching of tungsten or the like, the etching rate of a peripheral wafer portion is different from that of a central wafer portion. When an area having a low etching rate is completely etched, overetching occurs in an area having a high etching rate. An underlying material is etched in a considerable amount, and the pattern shape is undesirably changed when the size of the wafer is increased, it is impossible to form a desired pattern on the entire surface of the wafer.

In addition, when an insulating thin film such as a silicon oxide film is used as a mask, in an etching method using a plasma, ions and electrons in the plasma are incident on a thin film to he etched. The ions and electrons incident on the thin film cause charges to be accumulated in the thin film (charge-up). For example, when electrons are incident on a mask pattern from a diagonal direction, since the electrons are collided on any one of the right and left walls, amounts of charges to be accumulated in the right and left walls of the mask pattern are different from each other. An electric field newly generated due to asymmetry of the charge amounts in the right and left directions of the walls acts on ions to curve the movement direction of the ions, thereby degrading the anisotropy of the shape of the mask pattern. The micropattern cannot be easily etched with high accuracy.

When a metal material, especially AlSiCu or the like, is to be etched, after a resist film serving as an etching mask is removed and left to stand in the air, corrosion occurs in the metal material. Device characteristics are degraded, and a highly reliable device cannot be easily formed.

The following problems are posed by anisotropic etching of target substrates in accordance with conventional reactive ion etching techniques.

(1) It is impossible to etch a silicon oxide film to obtain a vertical side wall at a high selection ratio to the silicon oxide film.

(2) The etching rate of the central wafer portion is different from that of the peripheral wafer portion in a refractory metal film as of tungsten, a refractory metal silicide film, or a refractory metal oxide film when the size of the wafer is increased, thereby disabling uniformity on the entire wager.

(3) Since a dry etching selection ratio of the etching mask to a material to be etched is low in reactive ion etching, the thickness of the etching mask material is largely reduced during etching. In addition, when the temperature of the target substrate is increased, the mask pattern is degraded due to a low heat resistance of the mask material. Therefore, high-precision etching cannot be performed.

(4) Assume that copper or the like is etched at a high temperature. Since copper tends to be oxidized at high temperatures, a residue is produced, the shape is degraded, and diffusion of copper to the mask material occurs. As a result, the electrical characteristics are degraded, and excellent wiring layers cannot be obtained.

(5) when an organic thin film is used as a mask material, since the thin film contains an impurity such as fluorine (F), the impurity is mixed in a plasma during the reactive ion etching to maintain the Al, Al alloy, or Si thin film. Especially, corrosion caused by this contamination occurs, and a highly reliable device cannot be obtained.

(6) When a mask material is an organic material or comprises an insulating thin film such as a silicon oxide thin film, the mask pattern is charged up by an amount of charge stored in the mask due to a balance between electrons and ions incident on the thin film in a plasma. The incident direction of the ions are bent, and a micropattern cannot be formed with high precision.

(7) It is often impossible to remove a mask material without damaging a material to be etched and materials adjacent to the material to be etched due to a combination of the mask material and the material to be etched and a combination of the material to be etched and adjacent materials.

(8) while the required minimum size of a pattern is decreased and the required dimensional precision becomes more strict along with an increase in integration degree of semiconductor elements, a micropattern having a size of 0.5 $\mu$m or less is recently required, when an underlying thin film having a high reflectance, such as a polysilicon film and an aluminum film is to be patterned, light or an ultraviolet ray passing through the resist is reflected by the surface of the thin film during exposure, and a resist portion except other than the predetermined pattern is undesirably exposed to degrade the dimensional precision.

In order to solve the above problem, a method of forming a micropattern using a carbon film mask is proposed in, e.g., Published Unexamined Japanese Patent Application No. 58 212136. According to this method, a carbon film excellent in etching resistance is formed on the film to be etched. A resist is applied to the carbon film, and a resist pattern is formed by a conventional lithographic means. The carbon thin film is etched by reactive ion etching using this resist pattern as a mask. The resist is selectively removed from the carbon film by using an organic solvent to form a mask consisting of only the carbon thin film pattern. Reactive ion etching is performed using the carbon film pattern as a mask, thereby forming a thin film to be etched. Etching having a high selection ratio can be performed.

The carbon film formed on the film to be etched serves as an anti-reflection film, as described above, and an etching mask having resistance to dry etching.

In the step of forming the carbon film mask pattern, the organic resist is removed in an organic solvent, a solution mixture of $H_2SO_4$ and $H_2O_2$, or a solution obtained by adding $H_2O$ thereto. When the material to be etched consists of Al as a major constituent, and the resist is removed by the solution mixture of $H_2SO_4$ and $H_2O_2$, the material to be etched itself is also etched.

Even if an organic solvent is used, the photo-cured resist or the like cannot be perfectly removed. An alkaline organic solvent or the like has a limited number of types of thin films to be etched because a metal material such as Al may be etched or corroded.

In the process using a solution, a lot of problems are posed in view of solution management and safety measures in operations. Therefore, this process is not suitable for the process for manufacturing semiconductor elements in a dry state.

On the other hand, dry ashing is available to cause an oxygen plasma to remove an organic resist. According to this method, a sample having an organic resist film is placed in a barrel or flat parallel palate type discharge reaction chamber, and oxygen gas is discharge to remove the organic resist film. According to this method, as compared with the method using the solution, the resist can be easily removed, and an underlying material may be a metal. The type of underlying material is not limited to a specific one. However, according this dry ashing method, since the sample is placed in a discharge to obtain a predetermined removal or etching rate required in particle use, both the organic resist and the carbon film are undesirably etched. It is therefore impossible to remove the organic resist with high selectivity to the carbon film.

When a carbon film is to be used as an etching mask, it is important that the mask itself is processed at high accuracy. As a conventional technique of forming the mask, RIE is performed in an oxygen gas. However, when the oxygen gas is used, the etching rate of a resist is higher than that of a carbon film. For this reason, the resist may be removed during RIE, or although the resist is not entirely removed but is largely etched back (the side surface of the resist is etched to decrease a pattern width), and the resist has a large dimensional change. In addition, the elimination or etching back phenomenon of the resist during the RIE is not prevented by using a rare gas such as Ar. The elimination and etching back phenomenon of the resist are posed as problems when a carbon film is used as an etching mask.

After a film to be processed is selectively etched using a carbon film as a mask, the carbon film must be removed. The carbon film is generally removed together with the resist by an oxygen-plasma ashed or oxygen RIE using oxygen ions, or the carbon film is burned in an oxygen atmosphere at a temperature of 600° to 700° C. to remove the carbon film. However, in the former, the film to be processed is disadvantageously damaged by the oxygen ions. In addition, the latter cannot be performed when the film to be processed consists of a material such as aluminum having a low melting point.

SUMMARY OF THE INVENTION

It is an object of the present invention to provide a highly reliable method of manufacturing a semiconductor element, capable of forming a pattern with high precision, wherein various problems (e.g., an etching selection ratio to a target film, a selection ratio to an underlying material, charge-up, damage during mask removal, heat resistance, contamination of a target body, and a taper shape) caused by mask materials and dry etching can be eliminated at the time of anisotropic etching of the target substrate in accordance with dry etching techniques.

It is another object of the present invention to provide a method of manufacturing a semiconductor device capable of appropriately dry-etching an organic film pattern at high speed with a high selection ratio to the carbon film.

It is still another object of the present invention to provide a method of manufacturing a semiconductor device capable of appropriately dry-etching an organic film pattern at high speed with a high selection ratio to the carbon film, and the target substrate can be etched at a high selection ratio by using a carbon film pattern as a mask.

It is still another object of the present invention to provide an apparatus for manufacturing a semiconductor device, capable of appropriately dry-etching an organic film pattern at high speed with a high selection ratio to the carbon film, and the target substrate can be etched at a high selection ratio by using a carbon film pattern as a mask.

It is another object of the present invention to provide a dry-etching method in which, when a carbon film is to be dry-etched, the carbon film is anisotropically etched at a high rate faithfully to the dimensions of a resist pattern on the carbon film, a highly accurate pattern mask consisting of the carbon film can be formed.

It is still another object of the present invention to provide a method of manufacturing a semiconductor device, comprising the step of removing a carbon film without any damage to a film to be processed.

According to the present invention, there is provided a method of manufacturing a semiconductor device, comprising the steps of: forming a carbon film on a silicon oxide film formed on a substrate; forming an organic film pattern on the carbon film; etching the carbon film using the organic film pattern as a mask to obtain a carbon film pattern; removing the organic film pattern; and heating the substrate to a temperature of not less than 160° C., supplying an etching gas containing a gas having fluorine and carbon atoms, and anisotropically etching the silicon oxide film using the carbon film pattern as a mask.

According to the present invention, there is also provided a method of manufacturing a semiconductor device, comprising the steps of: forming a carbon film on a copper film formed on a substrate; forming an organic film pattern on the carbon film; etching the carbon film using the organic film pattern as a mask to form a carbon film pattern; removing the organic film pattern; and heating the substrate to a temperature of not less than 150°, supplying an etching gas, and anisotropically etching the copper thin film using the carbon film pattern as a mask.

According to the present invention, there is also provided a method of manufacturing a semiconductor device, comprising the steps of: forming a carbon film on a target film formed on a substrate, the target film being selected from the group consisting of a tungsten film, a nickel film, a titanium film, a tantalum oxide film, a strontium titanate film, an aluminum oxide film, and an aluminum nitride film; forming an organic film pattern on the carbon film; etching the carbon film using the organic film pattern as a mask to form a carbon film pattern; removing the organic film pattern; and heating the substrate to a temperature of not less than 130° C., supplying an etching gas, and anisotropically etching the target film using the carbon film pattern as a mask.

According to the present invention, there is also provided a method of manufacturing a semiconductor device, comprising the steps of: forming a carbon film on a target film formed on a substrate, the target film consisting of a metal or alloy containing aluminum as a major constituent; forming an organic film pattern on the carbon film; etching the carbon film using the organic film pattern as a mask to form a carbon film pattern; removing the organic film pattern; supplying an etching gas containing chlorine and/or bromine atoms, and anisotropically etching the target film using the carbon film pattern as a mask and heating the substrate to a temperature of 250° C. or more, preferably, falling within a range of 250° to 450° C.

According to the present invention, there is also provided a method of manufacturing a semiconductor device, comprising the steps of: forming a metal wiring layer containing aluminum as a major constituent and formed on a substrate; forming an insulating film on the metal wiring layer; forming a carbon film on the insulating film; forming an organic film pattern on the carbon film; etching the carbon film using the organic film pattern to form a carbon film pattern; removing the organic film pattern: supplying an etching gas having fluorine atoms, and anisotropically etching the insulating film using the carbon film pattern as a mask; and heating the substrate to a temperature of 250° C. or more, preferably, falling within a range of 250° to 450° C.

According to the present invention, there is also provided a method of manufacturing a semiconductor device, comprising the steps of: forming an insulating film on a substrate; forming a carbon film on the insulating film; forming an organic film pattern on the carbon film; etching the carbon film using the organic film pattern as a mask to form a carbon film pattern; removing the organic film pattern; supplying an etching gas, and anisotropically etching the insulating film using the carbon film pattern as a mask; and heating the substrate to a temperature of 250° C. or more, preferably, falling within a range of 250° to 800° C. Preferred embodiments of the present invention are exemplified as follows.

(1) In the etching step of the carbon film, oxygen, nitrogen, halogen gas, an inert gas (e.g., argon, krypton, or xenon), hydrogen, or fluorocarbon gas is used as an etching gas.

(2) The carbon film is formed by sputtering, vacuum deposition, or CVD.

(3) As a means for removing a resist pattern, a target substrate is placed in a vacuum vessel, a gas mixture consisting of a gas having at least fluorine atoms and oxygen gas is excited in an area other than the vacuum vessel, and an active species produced by this excitation is supplied to the vacuum vessel, thereby achieving down-flow etching.

According to the present invention, there is also provided a method of manufacturing a semiconductor device, comprising the steps of: forming a carbon film on a target substrate: forming an organic film pattern on the carbon film; etching the carbon film along the organic film pattern to form a carbon film pattern; and etching to remove the organic film pattern by an etching gas containing an active species having halogen atoms and an active species having oxygen atoms, or by an etching gas containing an active species having oxygen atoms or an etching gas containing an active species having halogen atoms and an active species having oxygen atoms during heating of the target substrate.

According to the present invention, there is also provided a method of manufacturing a semiconductor device, comprising the steps of: forming a carbon film on a target substrate, forming an organic film pattern on the carbon film; etching the carbon film along the organic film pattern to form a carbon film pattern; etching to remove the organic film pattern by a first etching gas containing an active species having halogen atoms and an active species having oxygen atoms, or by a first etching gas containing an active species of oxygen atoms or a first etching gas containing an active species of halogen atoms and an active species of oxygen atoms during heating of the target substrate; and anisotropically etching the target substrate; using the carbon film pattern as a mask and a second etching gas having halogen atoms.

According to the present invention, there is further provided an apparatus for manufacturing a semiconductor device, comprising: a first process chamber for storing a target substrate having a surface on which a carbon film and an organic film pattern are formed, and for etching to remove the organic film pattern by a first etching gas containing an active species having halogen atoms and an active species having oxygen atoms, or by a first etching gas containing an active species of oxygen atoms or a first etching gas containing an active species of halogen atoms and an active species of oxygen atoms during heating 0f the target substrate; and a second process chamber, connected to the first process chamber, for storing the target substrate which is conveyed from the first process chamber and from which the organic film pattern is removed, and for anisotropically etching the target substrate using the carbon film pattern as a mask and a second etching gas having halogen atoms.

According to the present invention, there is further provided a dry-etching method comprising the steps of: forming a carbon film on a substrate to be etched; forming a resist pattern on the carbon thin film; selectively etching the carbon film using the resist pattern as a mask by a plasma of a gas mixture of a gas containing fluorine atoms and a gas containing oxygen atoms which are mixed at an atomic ratio of fluorine to oxygen to 198:1 to 1:2 so as to form a carbon film pattern; and selectively etching the substrate to be etched using the carbon film pattern as a mask or the resist pattern and the carbon film pattern as masks.

According to the present invention, therein still further provided a dry-etching method comprising the steps of: forming a carbon film on a substrate to be etched; forming a resist pattern on the carbon thin film; selectively etching the carbon film using the resist pattern as a mask to form a carbon film pattern; selectively etching the substrate to be etched using the carbon film pattern as a mask or the resist pattern and the carbon film pattern as masks; heating the carbon film pattern; and removing the carbon film pattern by oxygen radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are sectional views showing the steps in forming a pattern according to Example 1 of the present invention;

FIG. 2 is a view showing a schematic arrangement of an etching apparatus used in Example 1 of the present invention;

FIG. 6 is a graph showing a relationship between a gas flow rate and an etching rate;

FIG. 8 is a graph showing a relationship between a substrate temperature and an etching rate;

FIG. 10 is a graph showing a relationship between a substrate temperature and a degassed component;

FIG. 16 is a graph showing a relationship between a total flow rate of $CF_4$ and $O_2$ gases and etching rates of a carbon film and a resist film;

FIG. 17 is a graph showing a relationship between a target substrate temperature and etching rates of a carbon film and a resist film;

FIG. 20 is a view showing a structure of a magnetron reactive ion etching apparatus used in Embodiments 9 and 10;

FIG. 23 is a graph showing the etching rates of a carbon film and a resist, an etching selection ratio of the etching rate of the carbon film to the etching rate of the resist, and the taper angle of the edge of a carbon film pattern as a function of an F/C ratio when $CHF_3$ and oxygen gases of Embodiment 10 are used.

FIG. 25 is a view showing a schematic arrangement of an etching apparatus used in Embodiment 12;

DETAILED DESCRIPTION OF THE PREFERRED EMBODIMENTS

Figure 3:
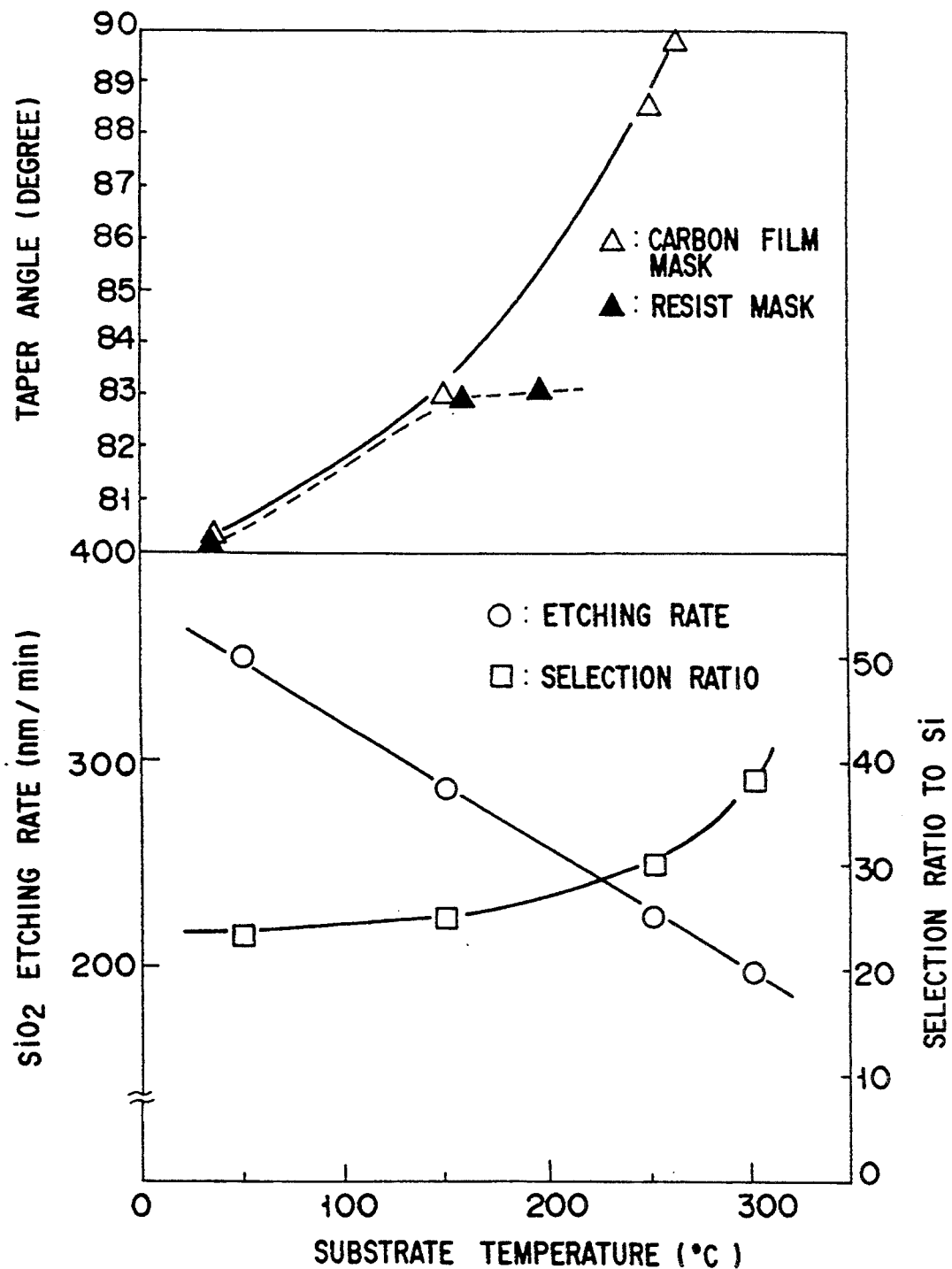
FIG. 3 is a graph showing a relationship between a substrate temperature, a taper angle of a side wall of a pattern, an etching rate, and a selection ratio.

According to the present invention, in order to examine by etching characteristics in use of a carbon film as an etching mask, a substrate temperature was changed from room temperature to 600° C., and an etching apparatus capable of performing reactive ion etching was prepared. Various gases were used as etching gases and the substrate temperature was changed to etch a silicon oxide film, a copper film, a tungsten film, or a tantalum oxide film. Etching rates, shapes of etched patterns, and their uniformity were examined.

A resist pattern was used as a mask, a reactive gas containing at least C, F, and H, such as $CHF_3$ gas, and CO gas were used, and a substrate temperature was changed from 50° C. to 300° C. at a predetermined pressure upon application of an RF power, thereby etching a silicon oxide film. When the substrate temperature was changed from 50° to 160°, a taper angle of a side wall of the resultant silicon oxide film pattern could be changed from 80° to 83°, so that the side wall could be close to a vertical side wall. When the substrate temperature was increased to 160° C. or more, the resist pattern is thermally deformed, and a pattern having desired pattern dimensions could not be obtained with high precision.

Etching of a silicon oxide film was performed under the same conditions as described above except that a carbon film was used as an etching mask. It was found that a taper angle of a side wall of the resultant silicon oxide film pattern etched at a substrate temperature of 50° C. was 80° and that at a substrate temperature of 170° C. was 83°. At a substrate temperature of 260°, a selection ratio for silicon was 20, and a taper angle was 90°, thereby satisfying both a high selection ratio to silicon and a highly precise etched shape. Although a substrate temperature was increased to 300° C. or more, neither degradation nor deformation of the carbon film mask itself were observed, and degassing was found to rarely occur. In addition, it was also found that the etching rate of the carbon film was very low.

Reactive ion etching had never been performed such that the substrate temperature was increased to a temperature which caused thermal degradation of the resist and the substrate temperature was controlled. However, it was found that high-precision etching of a silicon oxide film could be performed by using an appropriate etching gas and a carbon film mask at a high substrate temperature.

When a copper thin film was etched using chlorine gas as in the above method, it was found that the copper thin film was vertically etched at a substrate temperature of 250° C. or more and that the etching rate of the carbon thin film was low. That is, as can be apparent from the above fact, no residue is produced from a copper thin film which produces only an etching product having a very low vapor pressure in conventional dry etching, thereby achieving high-precision anisotropic etching.

When a mixing ratio of a gas mixture consisting of fluorine gas and chloride gas was appropriately changed to etch a tungsten film and a tantalum oxide film, uniformity of the etching rates of the tungsten film and the tantalum oxide film was improved with an increase in substrate temperature. Therefore, high-precision etching could be performed on the entire surface of the wafer.

The present inventors used a carbon thin film mask to etch a silicon oxide film having an underlying AlSiCu thin film or a silicon oxide film having an underlying Si substrate. The present inventors then performed annealing of the etched silicon oxide film in a vacuum or in a predetermined gaseous atmosphere upon an increases in substrate temperature. The present inventors found that a contaminant or residue produced by etching could be removed. By this annealing, corrosion or degradation of electrical characteristics of the device could not be observed. That is, a highly reliable device can be formed in formation of a wiring structure in a semiconductor integrated circuit and formation of a capacitor.

The present invention will be described in detail by way of its examples with reference to the accompanying drawings.

EXAMPLE 1

Example 1 of the present invention will be described with reference to FIG. 1.

As shown in FIG. 1A, a silicon oxide film 2 having thickness of 1.4 μm was deposited on a silicon substrate 1 by thermal oxidation. After a carbon film 3 was formed to have a thickness of 250 μm by sputtering, made of novolak resin (TSMR-CRB1: manufactured by Tokyo Oka Ltd.) a resist pattern 4 having a desired pattern was formed on the carbon film 3 in accordance with conventional photolithographic techniques. The carbon film 3 was vertically etched using the resist pattern 4 (thickness: 1.5 μm) as a mask in accordance with a dry etching technique, thereby forming a carbon film pattern 3.

The remaining resist 4 was removed by down-flow ashing using $CF_4/O_2$ gas. As shown in FIG. 1B, the carbon film pattern 3 was left on the silicon oxide film 2.

As shown in FIG. 1C, the silicon oxide film 2 was etched using a dry etching apparatus, thereby forming a silicon oxide film pattern 2a.

The step in FIG. 1C will be described in detail below.

The dry etching apparatus used in Example 1 will be described with reference to FIG. 2.

In the etching apparatus shown in FIG. 2, an etching chamber 20 comprises a vacuum vessel 20a, a first electrode 22 for supporting a target substrate 21 placed in the vacuum vessel 20a, an RF power source 24 connected to a blocking capacitor 29 to apply a 13.56-MHz RF power to the first electrode 22, and a heater 25 for heating the first electrode 22 and controlling the temperature of the target substrate 21 to a desired temperature. Alternatively, the substrate may be heated by a heated silicon oil circulating through the first electrode 22.

The etching chamber 20 is also connected to a $CHF_3$ gas supply line 28a and a carbon monoxide gas supply line 28b. $CHF_3$ and CO are supplied from the lines 28a and 28b to the vacuum vessel 20a, and an RF voltage is applied across the first electrode 22 and the inner wall (upper wall) of the vacuum vessel 20a serving as the second electrode.

The vacuum vessel 20a is grounded. The gas supply lines 28a and 28b have valves 28a and 29b and flow adjusters 30a and 30b, respectively. Therefore, the flow rates and gas pressures can be adjusted to desired values.

A permanent magnet 26 made of Sm—Co is arranged above the upper wall serving as the second electrode of the vacuum vessel 20a. The permanent magnet 26 is eccentrically rotated about a rotating shaft 27 by a motor. A high-density plasma can be generated and maintained even at a high vacuum of $10^{-3}$ Torr or less by a magnetic field of 50 to 500 Gauss generated by the permanent magnet 26. A large amount of ions are extracted from the high-density plasma and are radiated on the target substrate 21, thereby performing etching. In this case, a magnetic field strength on the surface of the substrate 21 is set to 120 gauss.

As shown in FIG. 1C. the silicon oxide film 2 was dry-etched using the dry etching apparatus shown in FIG. 2. A gas mixture of $CHF_3$ and CO was used as an etching gas. As etching conditions, a $CHF_3$ gas flow rate was 45 SCCM, a CO gas flow rate was 155 SCCM, a power was 2.6 W/cm², and a pressure was 40 mTorr. The substrate temperature was changed from 50° C. to 300° C. to perform etching.

FIG. 3 is a graph showing an etching rate of the silicon oxide film 2 etched with a change in substrate temperature, a selection ratio to silicon, and a taper angle of an etched section of the silicon oxide film pattern 2a upon observation with a scanning electron microscope (SEM).

As is apparent from FIG. 3, the taper angle of the wide wall of the pattern at a substrate temperature of 50° C. was 80°, the taper angle at a substrate temperature of 175° C. was 84°, and the taper angle at a substrate temperature of 260° C. was 90°, i.e., a vertical side wall. When the substrate temperature exceeded 260° C., etching of the silicon oxide film was accelerated by radicals in the plasma, and under-cut occurred immediately under the carbon film mask. The etching rate of the silicon oxide film was linearly decreased with an increase in substrate temperature. Since the etching rate of silicon was also linearly decreased in the range of 50° C. to 170° C. with an increase in substrate temperature, so that the selection ratio was not largely changed. However, in the temperature range of 170° C. or more, it was found that diffusion components from the carbon film pattern was increased, and then the etching rate of silicon was further decreased, thereby increasing the selection ratio in this temperature range.

As shown in FIG. 1D, only the carbon film pattern 3 was removed by $O_2$ plasma etching to obtain the highly precise silicon oxide film pattern 2a having a side wall ranging from a tapered side wall to a vertical side wall.

when the silicon oxide 2 was etched under the same conditions described above by using a resist pattern mask as n comparative example, the taper angle of the side wall could fall within the range of 80° to 83° in the temperature range of 50° C. to 160° C. when the substrate temperature exceeded 160° C., the resist pattern was thermally deformed, and it was difficult to obtain a pattern having desired dimensional precision.

The silicon oxide film was dry-etched using an etching gas containing only $CHF_3$ gas (i.e., without containing CO gas). Etching was performed under the same conditions (i.e., power: 2.6 w/cm²; pressure: 40 mTorr; and substrate temperature: 50° C. to 300° C.) except that CO gas was not used and the flow rate of $CHF_3$ gas was 200 SCCM.

The taper angles were respectively 74°, 84°, and 90° at substrate temperatures of 50° C., 125° C., and 170° C. using the etching gas containing only $CHF_3$. It was apparent that a vertical side wall could be obtained at lower temperatures than those using the etching gas containing $CHF_3$ and CO gases. At either temperature, a selection ratio to silicon was less than 10. When the content of CO gas was increased at the constant total flow rate of 200 SCCM, the selection ratio to silicon was 20 at a $CHF_3$ gas flow rate of 70 SCCM, a CO gas flow rate of 130 SCCM, and a substrate temperature of 170° C. At this time, the shape of the pattern was observed with an SEM, and the taper angle was 84°.

The pressure and power were changed in addition to the changes in substrate temperature described above. In either case, the taper angle and the selection ratio to silicon were slightly influenced.

It is found that the substrate temperature must be controlled to fall within the range of 160° C. (inclusive) to 260° C. (exclusive) to satisfy the taper angle of 83° C. and the selection ratio for silicon of 20 in Example 1. Though $CHF_3$ gas is used in Example 1, $CF_4$ gas or the like may be used. Further, $H_2$ gas may be used instead of CO gas or in addition to Co gas.

EXAMPLE 2

Example 2 using a carbon film as an etching mask in dry etching of copper (Cu) according to the present invention will be described below. Example 2 used a carbon film pattern in place of an organic material (e.g., a resist) as an etching mask because a halogen compound as of Cu had a low vapor pressure and a high ion energy impact and a high substrate temperature were required.

Figure 4A:
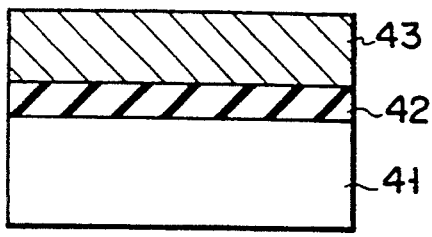
FIGS. 4A to 4H are sectional views showing the steps in forming a pattern according to Example 2 of the present invention.
Figure 4B:
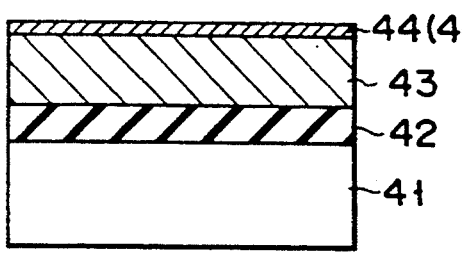

As shown in FIG. 4A, an $SiO_2$ film was formed on an Si substrate 41, and a Cu film (400 nm) 43 was formed on the $SiO_2$ film 42 by sputtering. As shown in FIG. 4B, a carbon film 44 having a thickness of 200 nm was formed by the same sputtering as described above. In addition, as a comparative example, a sample having a silicon oxide film ($SiO_2$) 44' having a thickness of 200 nm was also formed by sputtering.

Figure 4C:
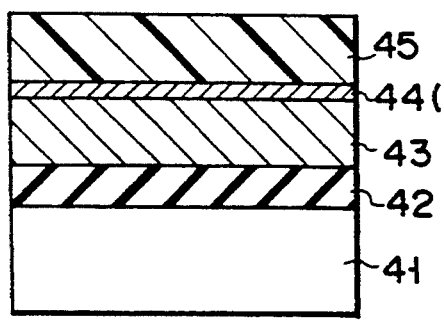
Figure 4D:
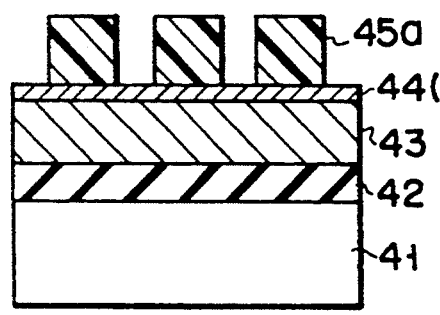

As shown in FIG. 4C, resist films 45 each having a thickness of 16 μm were deposited on the carbon film 44 and the $SiO_2$ film 44', respectively. The resist films 45 were exposed and developed using the conventional lithographic techniques, as shown in FIG. 4D, thereby forming resist patterns 45a. In the step shown in FIG. 4D, elusion and peeling of the carbon film 44 or the $SiO_2$ film 44' did not occur.

Figure 4E:
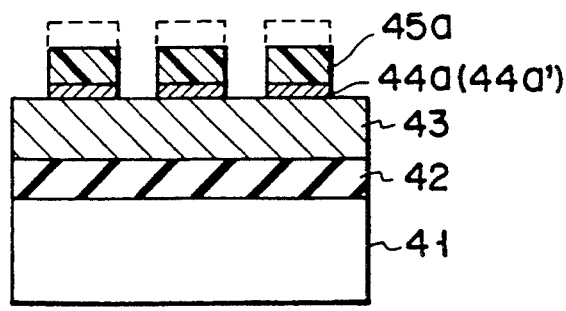

As shown in FIG. 4E, the carbon film 44 was patterned by reactive ion etching using the corresponding resist pattern 45a as a mask. A dry etching apparatus used in this case was a reactive ion etching apparatus having the magnetron. The etching conditions were set such that an $H_2$ gas flow rate was 100 SCCM, a pressure was 1.5 Pa. an RF power was 1.7 W/cm², and a substrate temperature was 25° C.

As shown in FIG. 4E, a carbon film pattern 44a was formed. The resist pattern 45a was left on the carbon film pattern 44a. The $SiO_2$ film 44' was patterned by the same etching apparatus as described above, using the corresponding resist pattern 45a as a mask. The $SiO_2$ film 44' was patterned by etching under the same conditions as described above, using $H_2$ gas, thereby obtaining the $SiO_2$ film pattern 44a'. The resist pattern 45a was left on the $SiO_2$ film pattern 44a'.

Figure 4F:
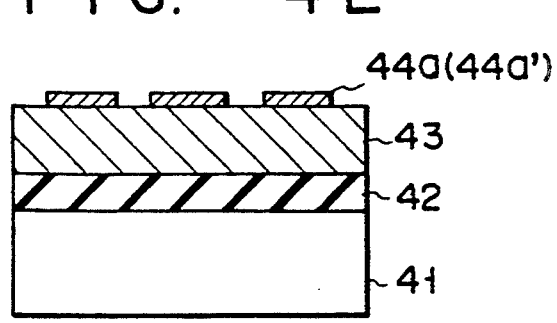

As shown in FIG. 4F, in order to remove the resist patterns 45a from the corresponding thin films, the resist patterns 45a were removed using an organic solvent. The resist patterns 45a respectively formed on the carbon film pattern 44a and the $SiO_2$ film pattern 44a' were perfectly etched and removed, thereby obtaining an etching mask pattern consisting of the carbon film pattern 44a or the $SiO_2$ film pattern 44a'.

Figure 4G:
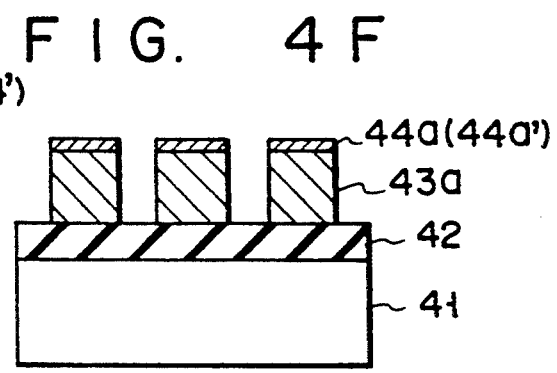

As shown in FIG. 4G, the Cu film 43 was etched using the carbon film pattern 44a or the $SiO_2$ film pattern 44'a as an etching mask. An etching apparatus was a reactive ion etching apparatus having a magnetron used as in Example 1. The etching gas was $Cl_2$ (total flow rate: 100 SCCM), a pressure was 0.5 Pa, an RF power was 1.7 W/cm², and a substrate temperature was changed from 200° C. to 400° C.

Figure 5:
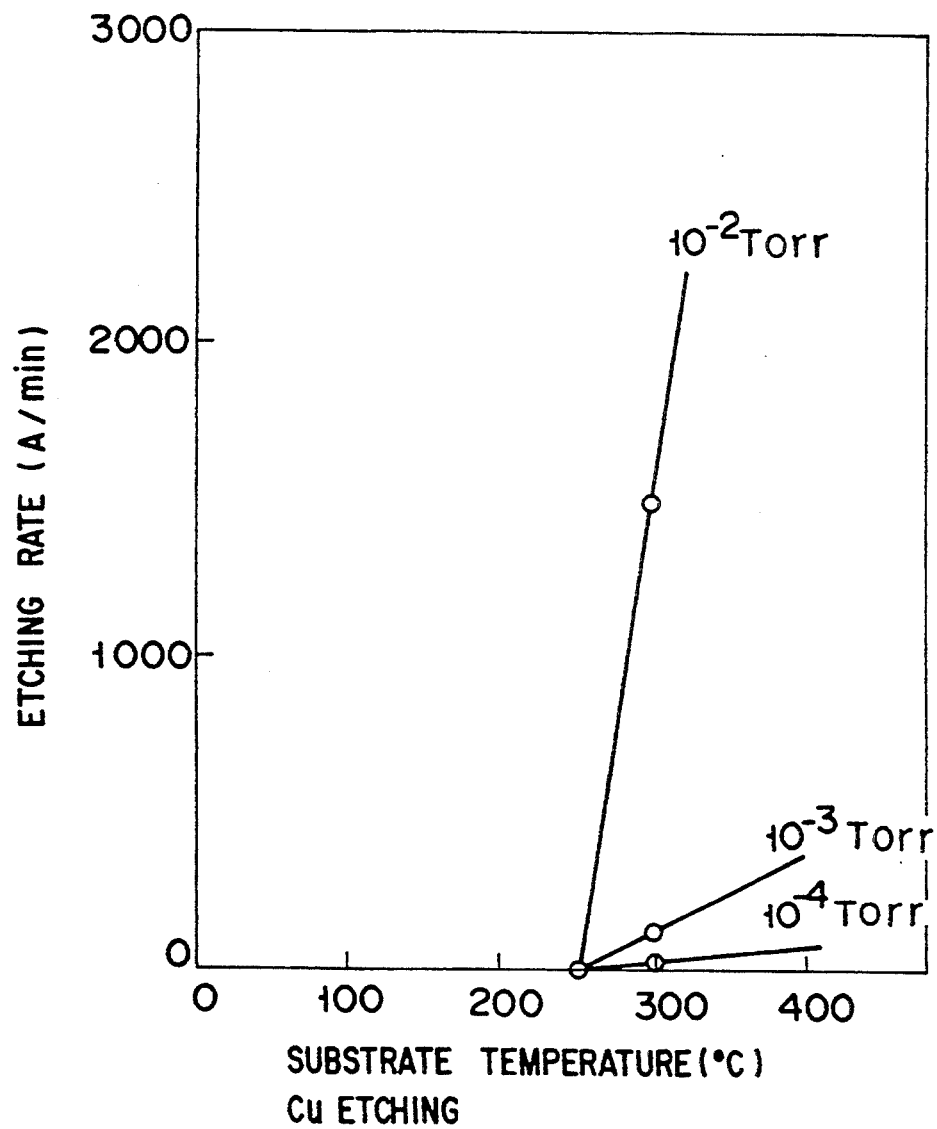
FIG. 5 is a graph showing a relationship between a substrate temperature and an etching rate.

The etching rate of the Cu film was measured while an RF power was not applied and the pressure and substrate temperature were changed. As shown in FIG. 5, Cu was found not to be etched at a substrate temperature of less than 250° C. even if the pressure was changed. When the pressure was increased, the etching rate of the Cu film was found to be increased. In addition, the carbon film pattern was not etched at all under the above conditions and was free from thermal deformation.

The RF power was applied to etch the Cu film. The etching rate of the Cu film was found to be low at a substrate temperature of less than 250° C.

Etching was performed after the substrate temperature was increased to 300° C. or more. As shown in FIG. 4G, Cu was etched to have an almost vertical side wall. In this case, no residue was observed.

The Cu etching rate was 400 nm/min, the carbon film etching rate was 100 nm/min, and the selection ratio of Cu to the carbon film was 4. Since the carbon film has heat resistance so as to serve as an excellent etching mask for reactive ion etching using a halogen gas even at high temperatures of 300° C. or more, high-precision etching for a halogen compound as of Cu having a low vapor pressure can be performed.

As a comparative example, etching using the mask pattern having the $SiO_2$ film formed on the Cu film was performed under the same conditions as described above. A residue was observed at a substrate temperature of 300° C. due to the following estimation. Oxygen is produce from the $SiO_2$ film during etching, so that a Cu etching produce is produced to locally oxidize the Cu etched surface and produce a Cu oxide having a very low vapor pressure. As a result, Cu tends not to be etched.

When a carbon film mask is used, no oxygen is produced from the mask. Carbon or a carbon chloride produced from the mask is reacted with moisture and oxygen present in the atmosphere of the residue to eliminate the moisture and oxygen. The Cu surface tends not to be oxidized, and no residue is produced.

A conventional resist pattern was formed on a Cu film, and the substrate temperature was increase to perform etching. Even if this resist pattern is a photocured resist pattern, the resist pattern was found to be thermally degraded at a substrate temperature of 160° C. or more. On the other hand, when a carbon film pattern was used as a mask, no pattern degradation occurred even at a substrate temperature of 400° C. or more.

Figure 4H:
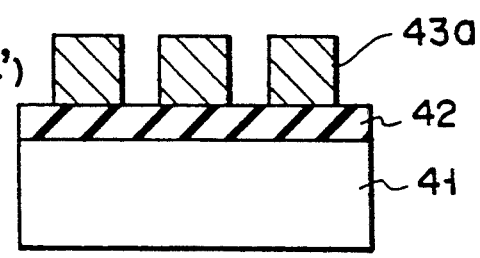

As shown in FIG. 4H, an etching apparatus using conventional parallel plate electrodes was used to etch and remove the carbon film pattern 44a from the Cu film 43. An etching gas was a gas (e.g., SF6 or NF3) containing at least fluorine atoms but not containing oxygen atoms, or $H_2$ gas. A pressure was 50 mTorr, an RF power was 150 W, and a substrate temperature was 50° C.

After the carbon film pattern 44a was removed, the shape of the Cu film pattern 43a was observed with an SEM. No degradation of the pattern was observed, and high-precision 0.4 μm line-and-space etching can be performed.

Where trialkyl phosphine is used as an etching gas, a Cu film can be etched at a temperature of 150° C. or higher.

Though $Cl_2$ gas is used in Example 2, HBr gas or a mixture containing HBr may be used.

EXAMPLE 3

Example 3 for applying the method of the present invention to formation of a tungsten pattern will be described below.

As shown in FIG. 4A, as in Example 2, a 10-nm thick silicon oxide ($SiO_2$) film 42 was formed on a silicon substrate 41 by thermal oxidation, and a 200-nm thick tungsten (W) film 43 was formed by CVD. As shown in FIG. 4B, a carbon film (thickness: 100 nm) 44 was formed on the tungsten film 43.

As shown in FIG. 4D, a photoresist was applied to the carbon film 44 and is patterned by the conventional lithographic techniques to obtain a resist pattern 45a. As shown in FIG. 4E, the carbon film 44 was etched by reactive ion etching using the resist pattern 45a as a mask and $H_2$ gas to obtain the carbon film 44 having a vertical side wall. As shown in FIG. 4F, the resist pattern 45a was removed by down-flow etching using $CF_4/O_2$ gas to form a carbon film pattern 44a.

As shown in FIG. 4G, the w film 43 was etched using the carbon film pattern 44a as an etching mask. The dry etching apparatus described above was used to etch the W film 43.

Figure 7A:
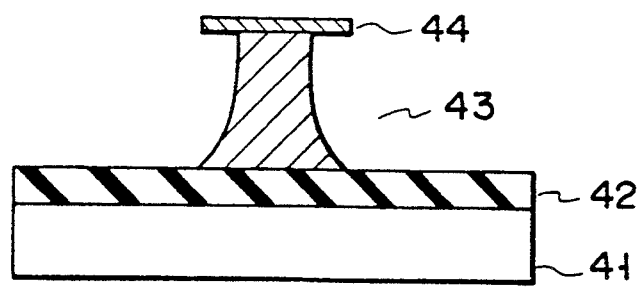
FIGS. 7A to 7C are sectional views showing different shapes of side walls of patterns in accordance with different gas compositions.
Figure 7B:
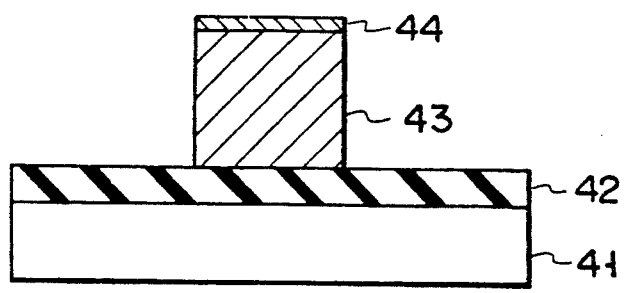
Figure 7C:
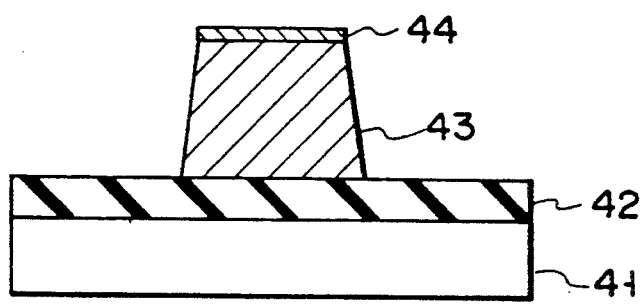

The etching conditions were set as follows. A gas pressure within the reaction vessel was 50 mTorr, an etching gas was $Cl_2$ gas or $SF_6$ gas, or a mixture thereof, and an RF power was 150 W. In this case, the mixing ratio of the gas mixture was changed to perform etching at room temperature. As shown in FIG. 6, when $SF_6$ gas (100%) was used as an etching gas, the etching rate of the W film was 350 nm/min. To the contrary, when $Cl_2$ gas (100%) was used as an etching gas, the etching rate of the W film was found to be reduced to 20 nm/min. At this time, the etching rate of the carbon film was found to be 10 nm/min for the $SF_6$ gas (100%) and to be as small as 5 nm/min for the $Cl_2$ gas (100%). The distribution of the etching rates within the wafer was measured. It was found that the peripheral portion of the wafer had the highest etching rate for the $SF_6$ gas and that uniformity was as low as 75% (3σ/x: average etching rate). The sectional shape of the etched pattern was observed with an SEM. Under-cut of the w film 43 occurred in the presence of $SF_6$ gas (100%), as shown in FIG. 7A. The side wall of the pattern was tapered in the presence of $Cl_2$ gas (100%), as shown in FIG. 7C. Therefore, the side wall was tapered, and high-precision patterned could not be performed.

Etching was then performed while the mixing ratio of the gas mixture of $SF_6$ and $Cl_2$ was appropriately changed and the substrate temperature was increased. As a result, a vertical side wall shown in FIG. 7B could be obtained at a partial pressure ratio of $C_2l$ to $SF_6$ being 7:3 at a substrate temperature of 130° C.

As shown in FIG. 8, the etching rate of the W film was increased with an increase in substrate temperature. More specifically, an etching rate was 450 nm/min at 130° C., while the etching rate of the carbon film was as small as 50 nm/min. Therefore, the W film was found to be etched at a high selection ratio. A measured distribution of etching rates within the wafer is shown in FIG. 8. As is apparent from FIG. 8, etching uniformity was improved with an increase in substrate temperature. Uniformity (3σ/x) at a substrate temperature of 160° C. was found to be 10% due to the following reason. The concentration of tungsten chloride ($WCl_6$) as an etching product is higher at the central portion of the wafer than at the peripheral portion thereof. When the product is deposited again, the etching rate is decreased. This may derive the following estimation. Although the etching rate at the central portion of the wafer is lower than that at the peripheral portion thereof, the vapor pressure of the etching product ($WCl_6$) or the like is increased with an increase in substrate temperature. Therefore, redeposition tends not to occur. When the substrate temperature was further increased, the etching rate was increased and etching uniformity was improved. However, under-cut occurred.

Etching was performed by adding CO gas in this region. The etching rates of the W film and the carbon film were decreased with an increase in CO gas, but under-cut was suppressed. The shape of the pattern could be controlled by adding CO gas. In addition, etching uniformity was found not be largely changed by adding CO gas.

In order to highly precisely etch the W film and the like at a high etching rate with high uniformity within the wafer, it was very effective to increase the substrate temperature and perform etching using the carbon film mask at a high selection ratio. The shape of the etched pattern was changed with an increase in substrate temperature. In this case, the mixing ratio of the etching gas was appropriately changed, or, CO gas, for example, was added to the etching gas, thereby performing high-precision etching.

Finally, as shown in FIG. 4H, the carbon film pattern 44a was etched in a barrel type plasma etching apparatus using $O_2$ gas. After the carbon film pattern 44a was removed, the W film pattern 43a was evaluated with an SEM. It was found that a vertical 0.4 μm wide line pattern was found to be formed on the entire surface of the wafer.

Though Cl$_2$ gas and SF$_6$ gas are used in Example 3, HBr gas or a mixture containing HBr may be used.

EXAMPLE 4

Example 4 for applying the present invention to formation of an Al alloy film pattern will be described below.

Figure 9A:
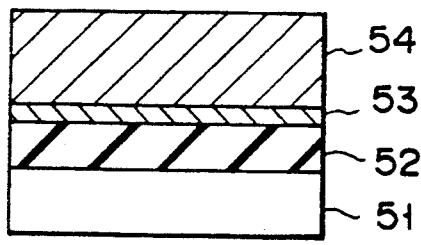
FIGS. 9A to 9F are sectional views showing the steps in forming a pattern according to Example 4 of the present invention.
Figure 9E:
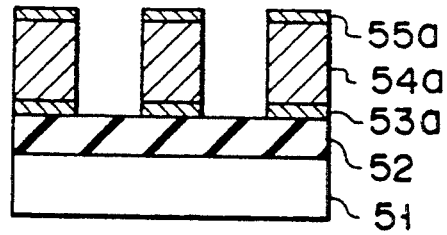
Figure 9B:
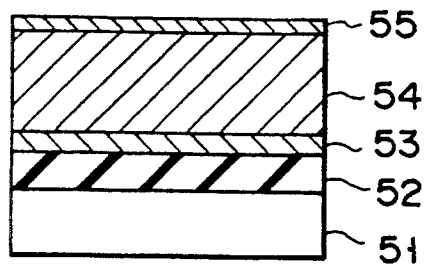
Figure 9F:
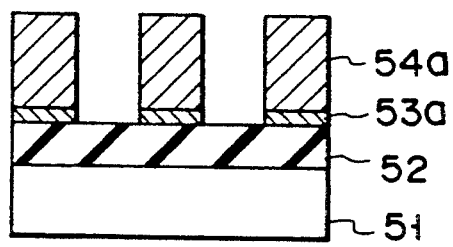

FIGS. 9A to 9F are sectional views showing the steps in forming an Al alloy film pattern. As shown in FIG. 9A, an SiO$_2$ film 52 was formed on an Si substrate 51. A Ti film and a TiN film (constituting a TiN/Ti film 53), and an AlSiCu thin film 54 (Si: 1 wt %; Cu: 0.5 wt %) were sequentially deposited on the SiO$_2$ film 52. The surface of the AlSiCu thin film 54 was exposed in a plasma using oxygen gas to modify the surface of the AlSiCu thin film 54. As shown in FIG. 9B, a carbon film 55 (thickness: 200 nm) was formed on the thin film 54. Note that the carbon film 55 was deposited by a magnetron sputtering apparatus.

Figure 9C:
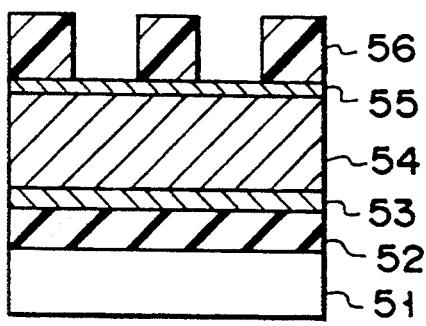

As shown in FIG. 9C, a photoresist 56 (thickness: 1.6 μm) applied to the carbon film 55, and was exposed and developed using the conventional lithographic techniques to form a resist pattern 56. In the step of FIG. 9C, an alkaline organic solvent was used as a developing solution. However, elusion and the like of the AlSiCu film 54 did not occur because its underlying layer was the carbon film 55.

Figure 9D:
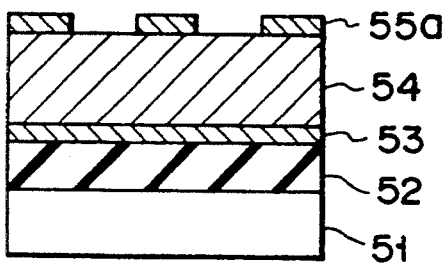

The carbon film 54 was patterned by reactive ion etching using the resist pattern 56 as a mask. A dry etching apparatus used in this etching process was a reactive ion etching apparatus having the magnetron described above. Etching conditions were set as follows. An H$_2$ gas flow rate was 100 SCCM, a pressure was 1.5 Pa, an RF power was 1.7 W/cm$^2$, and a substrate temperature was 25° C. A carbon film pattern 55a was formed. Only the resist pattern 56 was removed from the carbon film 55 by a down-flow ashing apparatus using CF4/O$_2$ gas. As shown in FIG. 9D, the resist pattern 56 was perfectly etched and removed, and an etching mask pattern consisting of the carbon film 55 was formed.

As shown in FIG. 9E, the AlSiCu film 54 and the TiN/Ti film 53 were etched using the carbon film 55a as an etching mask. This etching was performed using the dry etching apparatus having the magnetron described above. The etching conditions were set as follows. A substrate temperature was maintained at 25° C., an etching gas was a gas mixture of Cl$_2$ and BCl$_3$, an etching pressure was 2.0 Pa, and an RF power was 0.8 W/cm$^2$.

At this time, the etching rate of the AlSiCu film 54 was about 350 nm/min, the etching rate of the TiN/Ti film 53 was about 150 nm/min, the etching rate of the carbon film was 20 nm/min, and a selection ratio of the AlSiCu film to the carbon film was about 13. An amount of residue produced on the wafer under the above conditions was measured, but no residue was observed. The shape of the etched AlSiCu film 54 was observed with an SEM, and a pattern having an almost vertical side wall was obtained. After etching, the above sample was annealed in an N$_2$ atmosphere such that the substrate was heated at 200° C. for 2 min. The annealed sample was left to stand in air, and corrosion was evaluated with an optical microscope. Even if the sample was left to stand in air for a week, no corrosion was observed. When corrosion was evaluated while the sample was left to stand and moistened, corrosion was observed with a lapse of 6 hours.

The substrate was heated to 350° C. upon etching, and was annealed for 2 min. No corrosion was observed while the sample was left to stand and moistened for 6 hours.

In order to examine a corrosion mechanism, a gas produced from the substrate was examined using a TDS method (Thermal Desorption Spectra), i.e., heating the substrate, in accordance with a mass analysis method. As shown in FIG. 10, it was found that Cl as an etching gas component and AlCl as an etching product were produced from the substrate with an increase in substrate temperature. It is thus estimated that corrosion during exposure at a high humidity may be caused by the residual Cl and ACl upon etching. When the substrate was heated to 450° C. by the TDS method, the Cl and ACl components were found to be perfectly eliminated. In the prior art, when a resist film mask is used, the resist is thermally deformed near 160° C., and decomposed components from the resist are attached to the AlSiCu film pattern, so that corrosion heavily occurs.

To the contrary, by using the heat-resistant carbon film mask almost free from degassing, it is possible to increase the substrate temperature to about 500° C. prior to removal of the carbon film pattern. In practice, even if the substrate temperature was increased to 1,100° C., degassing was not observed from the carbon film mask 55, and degradation of the pattern by thermal deformation was not observed, either. However, when annealing was performed at a temperature exceeding 450° C., the AlSiCu film 54 was thermally deformed. Therefore, annealing is preferably performed at a temperature of 250° C. to 450° C.

EXAMPLE 5

Example 5 of the present invention will be described as an example for applying a carbon film as an etching mask in the process for forming a connecting portion (via contact) between upper and lower metal wiring layers with reference to FIGS. 11A to 11E.

Figure 11A:
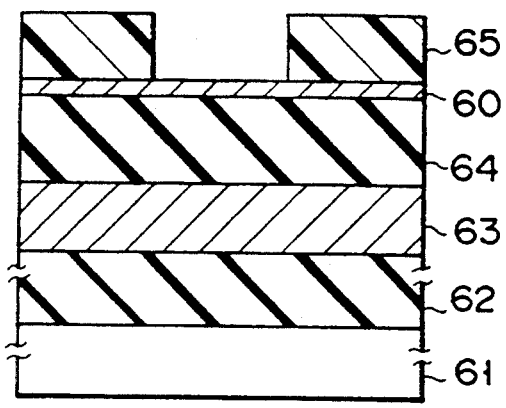
FIGS. 11A to 11e are sectional views showing the steps in forming a pattern according to Example 4 of the present invention.

As shown in FIG. 11A, a first metal wiring layer 63 such as an Al alloy wiring film (Si: 1 wt %; Cu: 0.5 wt %) having a thickness of about 800 nm was deposited on a first insulating interlayer 62 deposited on n semiconductor substrate 61 having an element thereon in accordance with sputtering. An SiO$_2$ film 64 was deposited by a low-temperature CVD (Chemical vapor Deposition) apparatus using TEOS (tetraethoxysilane).

As described in Examples 1 to 4, a carbon film 60 having a thickness of 200 nm was deposited on the SiO$_2$ film 64 by sputtering. A photoresist 65 was deposited on the carbon film 60, and the photoresist 65 was removed from only a prospective connection hole forming portion of the second insulating interlayer 64 in accordance with the conventional photolithographic process.

Figure 11D:
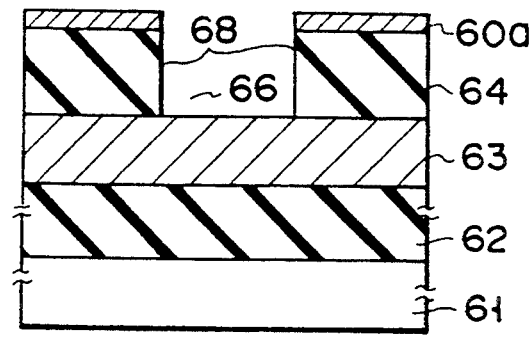
Figure 11B:
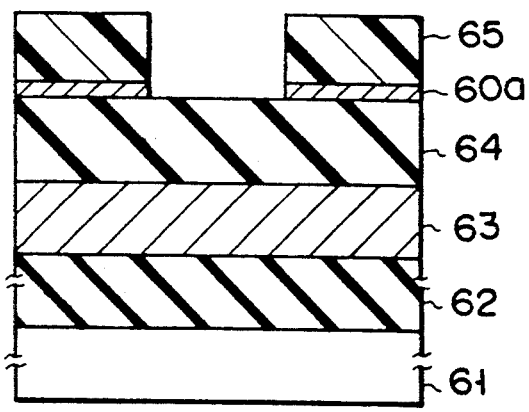

As shown in FIG. 11B, as described in Example 2 in detail, a carbon film 60 was anisotropically etched by a dry etching technique using H$_2$ gas and the photoresist 65 as a mask, thereby forming a carbon film pattern 60a. As shown in FIG. 11C, the resist film 65 was etched following the same procedures as in Example 2 in accordance with down-flow ashing using the CF4/O$_2$ gas.

As shown in FIG. 11D, the SiO$_2$ film 64 was anisotropically etched by reactive ion etching using the dry etching apparatus as in Examples 1 to 4 until the first metal wiring layer 63 was exposed, thereby forming a connection hole 66. At this time, the etching conditions were set as follows. An etching gas was CHF$_3$, a power was 1.4 W/cm$^2$ a pressure was 40 mTorr a gas flow rate was 20 SCCM, and a substrate temperature was 150° C. The etching rate of the SiO$_2$ was measured to be 200 nm/min, and the shape of the etched film was observed with an SEM. The side wall of the connection hole was almost vertical. However, when the substrate temperature during etching was decreased to 100° C. or less, the side wall of the SiO$_2$ film 64 defining the connection hole could be tapered.

When the connection hole had a vertical side wall, a small amount of deposited substance 68 was formed on the side wall. However, when the substrate temperature was decreased during etching and a tapered side wall was obtained, no deposited substance 68 was observed.

As described with reference to Example 2, the carbon film 60 was removed by O$_2$ gas plasma etching. A second metal wiring layer 67 (e.g., an AlSiCu film) was deposited on the entire surface by sputtering and was patterned to form the second wiring layer.

As a comparative example, a resist used in the conventional fabrication method was used as an etching mask to form a via contact.

Figure 11E:
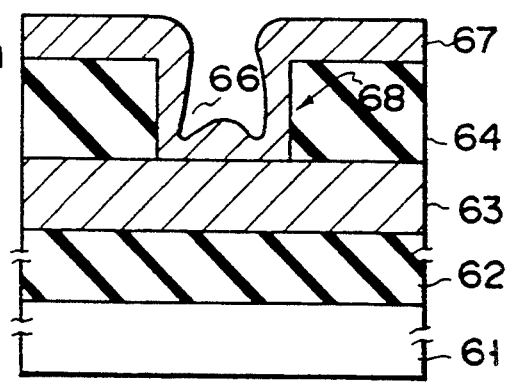
Figure 11C:
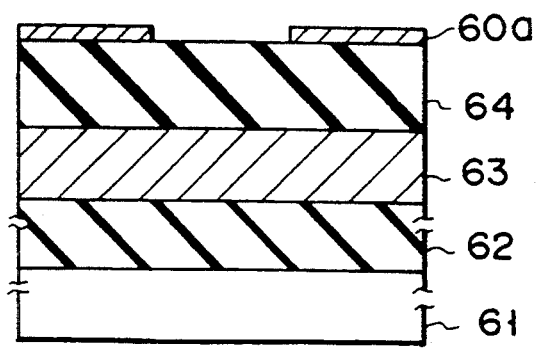
Figure 12A:
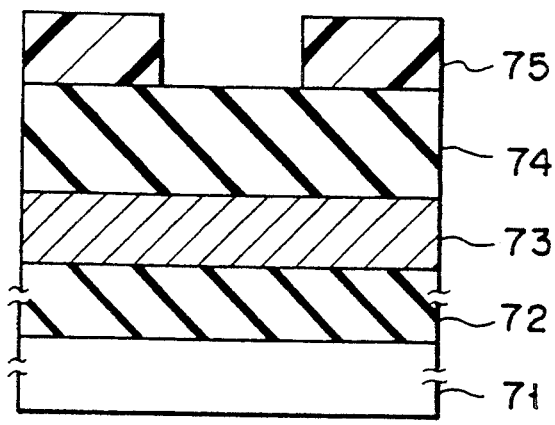
FIGS. 12A to 12C are sectional views showing the steps in forming a pattern according to Example 5 of the present invention.

As shown in FIG. 12A, an AlSiCu film 73 (Si: 1 wt %; Cu: 0.5 wt %) having a thickness of about 800 nm was deposited as an Al alloy wiring layer on a first insulating interlayer 72 deposited on a semiconductor substrate 71 having an element formed thereon. An SiO$_2$ film 74 was deposited on a second insulating interlayer in accordance with low-temperature plasma CVD. These steps are substantially the same as those in FIGS. 11A to 11E.

Figure 12B:
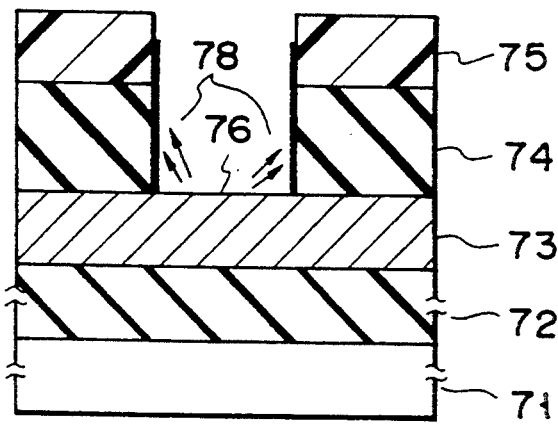

A photoresist (thickness: 1.6 μm) was deposited on the SiO$_2$ film 74, and the resist 75 was removed from only a prospective connection hole forming portion of the second insulating interlayer 74 in accordance with a conventional photolithographic process. As shown in FIG. 12B, the SiO$_2$ film 74 was anisotropically etched using CHF$_3$ gas and the resist 75 as a mask under the same conditions as described above until the first metal wiring layer 73 was exposed, thereby forming a connection hole 76.

At this time, the side wall of the connection hole defined by the SiO$_2$ film 74 was slightly tapered at a substrate temperature of 130° C. when the resist 75 was removed by conventional O$_2$ plasma ashing, a deposited substance 78 called a fence was formed on the side wall of the connection hole defining the SiO$_2$ film 74, as shown in FIG. 12, in an amount larger than that obtained in the process using the carbon film 60 in FIGS. 11A to 11E. When the substrate temperature was decreased during etching and the side wall of the connection hole defined by the SiO$_2$ film 74 was tapered, no deposited substance 78 was observed.

Figure 12C:
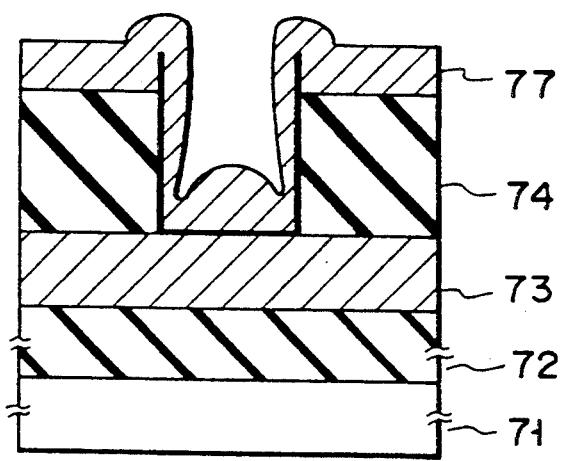

As shown in FIG. 12C, an AlSiCu film 77 serving as the second metal wiring layer was deposited on the entire surface by sputtering and was patterned to form a second metal layer 77.

Corrosion properties of via contact holes formed in the process (FIGS. 11A to 11E) using the carbon film as a mask and in the process (FIGS. 12A to 12C) using the resist as a mask were evaluated. This evaluation was performed such that each sample was left to stand in air for a long period of time and corrosion amount within the chip was examined with a microscope. As a result, in the process using the resist as the mask, corrosion was observed in a large amount. However, in the process using carbon as a mask, no corrosion was observed even if the sample was left to stand for a week.

Figure 13:
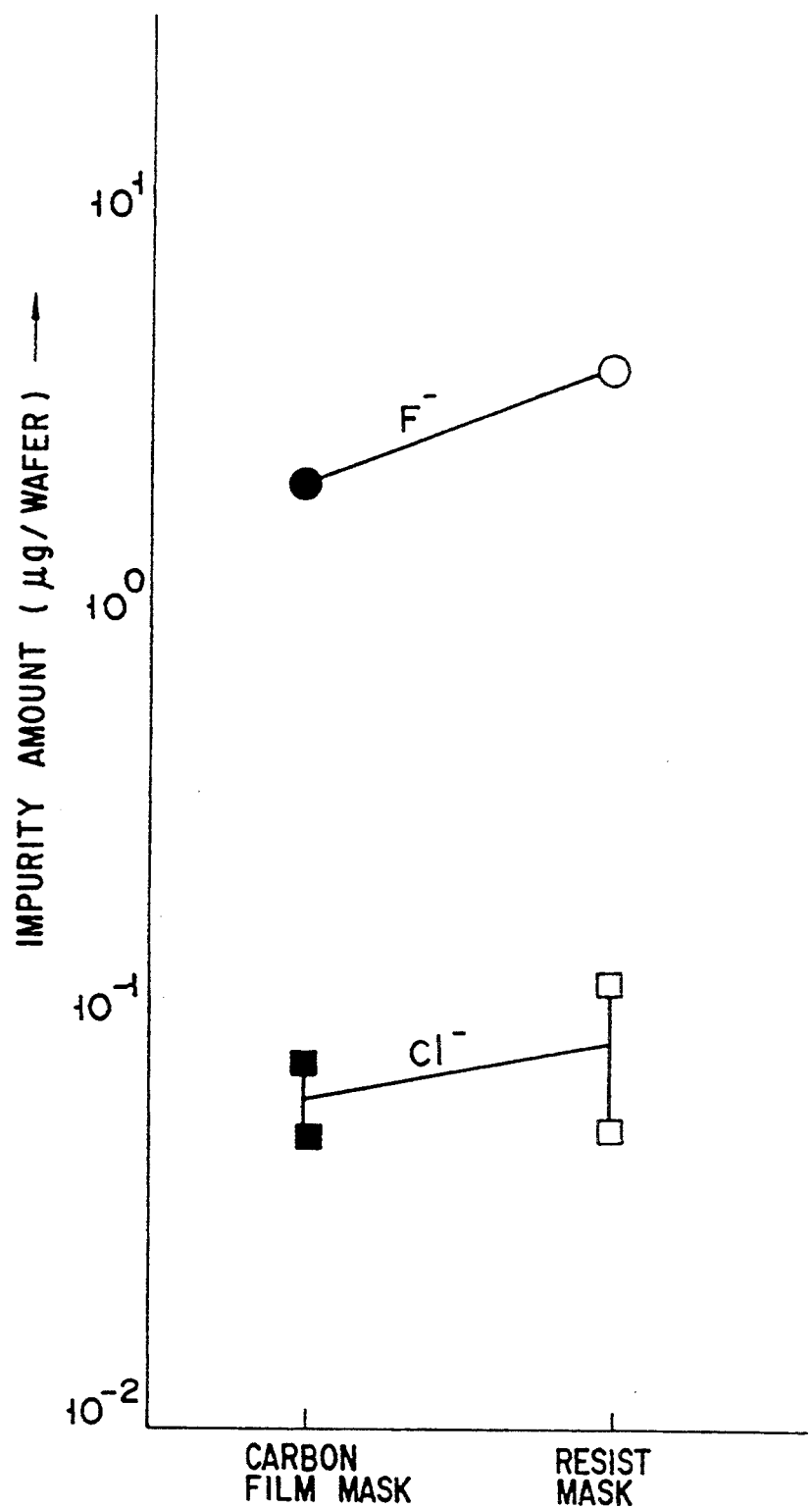
FIG. 13 is a graph showing an impurity amount obtained in use of a carbon mask in comparison with an impurity amount obtained in use of a resist mask.

In order to clarify the cause of corrosion, a wafer having a via hole was dipped in distilled water, and ion chromatographic analysis was performed. Cl and F were detected as impurities, as shown in FIG. 13. In particular, an amount of Cl and F measured using the carbon film mask was found to be larger than that measured using the resist mask.

When the wafer is left to stand in air upon formation of a connection hole, the first metal wiring layer 73, an impurity containing Cl and F on the surface of the layer 73, and moisture in air are reacted with each other to form HCl and HF. When HCl and HF were contained in water, water becomes an electrolyte, thus causing the following reactions:

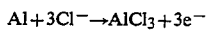

Once these reactions occur, AlSiCu constituting the first metal wiring layer 73 may be corroded by the produced Cl.

As shown in FIGS. 11D and 12B, an impurity contained in the photoresist 75 is emitted in the plasma, and the impurity is attached to the side wall of the via hole. The impurity is not attached to the carbon film because it is highly pure.

When etching reaches the upper surface of the underlying first metal wiring layer 73, metals contained in the first metal wiring layer and atoms contained in the mask material (75 or 60) and the SiO$_2$ film 74 are sputtered, and these substances are attached to the side and bottom surfaces of the connection hole 76. Since these substances cannot be eliminated by O$_2$ ashing, a deposited substance (fence) 78 is formed on, e.g., the side surface of the connection hole. In a post process, overhanging occurs during sputtering of the upper second metal wiring layer 77, thereby causing poor step coverage or disconnection of the wiring layer.

To the contrary, when a carbon film is used as an etching mask, an amount of decomposed substance is small during plasma etching, and the amount of substance deposited on the side wall of the via hole can be reduced. Wiring disconnections do not occur. Since an impurity such as Cl and S is produced from a resist mask, the impurity is reacted with moisture in air upon removal of the resist, thereby forming Cl$^-$ and F$^-$ ions. Corrosion occurs in a large amount. To the contrary, since the resist is removed in advance in the carbon film mask, an amount of the impurity in the via hole is reduced. Therefore, no corrosion occurs.

Corrosion was evaluated when the sample was left to stand in air and moistened. Corrosion occurred with a lapse of 6 hours as in Example 4. Various post processes were taken into consideration to suppress corrosion.

More specifically, after a contact hole was formed, the substrate temperature was increased to 250° C. or more or the sample was exposed to Si$_2$H$_6$ or CO gas. F or S left on the surface of AlSiCu was directly reacted with Si, CO, or H and SiH$_x$ decomposed from SiH$_4$, thereby producing SiH$_x$F, COF, HF, HS, and COS as a result of mass analysis. The residues left on the SiO$_2$ or AlSiCu surface upon etching could be removed by a post process by substrate heating and proper selection of a reactive gas.

Corrosion of the sample was evaluated while the treated sample was moistened. No corrosion was observed. In this process, the substrate must be heated to a temperature of 250° C. or more. When the resist mask was used, components degassed from the resist were attached to the $SiO_2$ or AlSiCu surface and could not be perfectly removed. It was found that the above process could be performed using a heat-resistant carbon film mask having a very small amount of degassed components. As shown in Example 4, since the underlying AlSiCu film was thermally deformed, post annealing was found to be appropriately performed in the temperature range of 250° C. to 450° C.

Finally, as shown in FIG. 11E, the carbon film 60 was removed by conventional $O_2$ plasma ashing, electrical characteristics of the resultant wiring structure were evaluated, and a highly reliable device having good characteristics can be obtained.

EXAMPLE 6

Example 6 according to the present invention exemplifies use of a carbon film as an etching mask in a step of forming a metal wiring contact hole in a semiconductor device will be described with reference to FIGS. 14A to 14D.

Figure 14A:
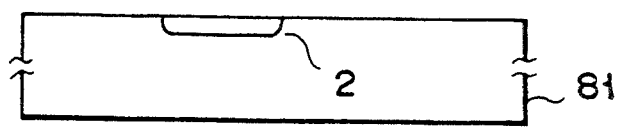
FIGS. 14A to 14D are sectional views showing the steps in forming a pattern according to Example 6 of the present invention.
Figure 14B:
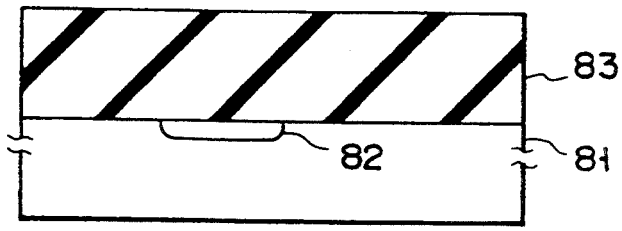

As shown in FIG. 14A, an impurity was doped in an Si substrate 81 having a plane direction of (100) to form a diffusion layer 82. As shown in FIG. 14B, an $SiO_2$ film was deposited to have a thickness of about 600 nm by CVD, and BPSG (BoroPhosphoSilicate Glass) was deposited on the $SiO_2$ film to a thickness of about 600 nm. The surface was flattened through a low-temperature reflow step, and an insulating interlayer 83 was formed.

Figure 14C:
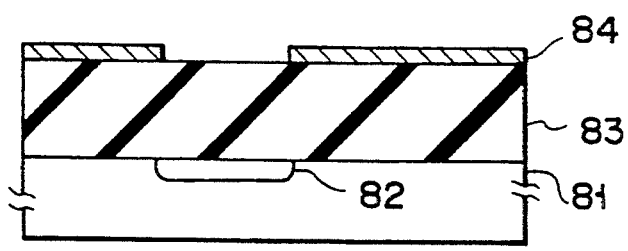
Figure 14D:
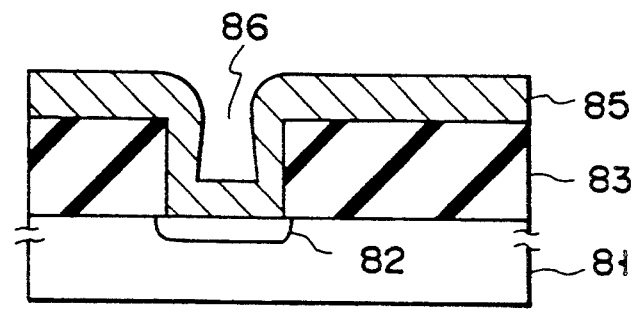

A hole will be formed in the insulating interlayer as follows. In this step, as shown in FIG. 14C, a photoresist was deposited on the insulating interlayer and a hole was formed in the insulating interlayer 83 in accordance with conventional dry etching techniques following the same procedures as in Example 5. The hole was formed in the insulating interlayer 83 using a carbon film as a mask in the steps of FIGS. 11A to 11D.

After a mask 84 consisting of a resist or carbon film was removed, an AlSiCu thin film 85 serving as a wiring metal film was deposited on the entire surface so as to bury a contact hole 86 which exposes the diffusion layer 82.

The properties of the contact holes thus formed were evaluated. An increase in contact resistance, junction breakdown, variations in contact resistances, and corrosion of the AlSiCu wiring layer were found for the contact hole formed using the resist as the mask. An increase in corrosion amount of the contact portion was observed with a lapse of time, as shown in FIG. 13. To the contrary, degradation such as an increase in contact resistance, and corrosion were not observed.

In the contact hole formed using the resist mask, impurities such as S, F, and Cl as components decomposed from the resist during reactive ion etching may be attached to the contact hole to cause degradation of electrical characteristics. On the other hand, in the contact hole formed using the carbon film mask, since an etching selection ratio is high, the carbon film is rarely degraded during etching. In addition, when carbon is attached in the contact hole, it does not cause corrosion of the wall surface of the contact hole. Therefore, it is assumed that electrical characteristics are not degraded.

When a carbon-containing halogen gas such as $CHF_3$ is used as an etching gas, thee electrical characteristics are not degraded because the etching gas itself contains carbon.

A corrosion acceleration test while the sample was left to stand and moistened was performed following the same procedures as in Example 5. Corrosion was observed in the sample formed using the carbon film mask. As in Example 5, the substrate temperature was increased to 250° C. or more, and the sample was exposed to a gas such as $Si_2H_6$, CO, or $B_2H_6$. Residual substances on the Si or $SiO_2$ surface could be removed. In this process, no thermal deformation of the Si or $SiO_2$ did not occur even if the substrate temperature was increased to about 1,000° C. However, an impurity distribution in a diffusion layer formed in Si substrate changes at 800° C. It is, therefore, desirable that heating temperature of the substrate is 800° C. or lower so that the impurity distribution does not change.

The characteristics of the contact hole upon completion of the above treatments were evaluated. Even in the corrosion acceleration test performed while the sample was left to stand and moistened, no corrosion was observed. In addition, degradation of electrical characteristics such as an increase in contact resistance was not observed. Therefore, a highly reliable device can be manufactured.

In Examples 1 to 6, the magnetron reactive ion etching apparatus having parallel plates was used as an etching apparatus. However, a reactive ion etching apparatus using an ECR electric discharge applied with a microwave, a reactive ion etching apparatus for applying a target substrate to be etched in the presence of a discharge plasma produced upon application of a microwave or electron beam, or a conventional etching apparatus using parallel plates may be used.

In Example 4, etching of a tungsten film was exemplified. However, a carbon film can be used as an etching mask for nickel, titanium, tantalum, a tantalum oxide, strontium titanate, an aluminum oxide, an aluminum nitride, a refractory metal, a refractory metal silicide, a metal oxide, and a metal nitride, and substrate temperatures are then increased to etch these materials.

In order to examine dry etching properties of carbon and organic resist films, a down-flow etching apparatus, a cylindrical etching apparatus, and parallel plate type etching apparatus were used, various etching gases were used, and etching gas pressures, RF or microwave powers, and substrate temperatures were changed to measure etching rates.

In the cylindrical and parallel plate type etching apparatuses, when organic resist films were to be etched and removed at high etching rates, carbon and organic resist films were dry-etched. Selective etching of the organic resist film with respect to the carbon film was found to be impossible. Voltage dependency of the carbon film in the oxygen plasma was examined. It was found that etching was abruptly progressed from a given voltage.

On the other hand, the etching rate of the resist was monotonously increased as a function of voltage applied thereto. A voltage applied across the resist and the plasma is preferably minimized.

In etching using a gas mixture of carbon tetrafluoride and oxygen in the down-flow etching apparatus for performing etching by means of radicals without causing ion bombardment, when the mixing ratio is set to be a given value, the organic resist film was etched at a high etching rate, and the carbon film was rarely etched.

When ozone or a gas mixture of carbon tetrafluoride and steam was used under the control of substrate temperatures, the organic resist film was etched at a high etching rate, and the carbon film was rarely etched.

In the above cases, Al, silicon, a silicon oxide film, or a metal film was found not to be etched at all.

When the etching conditions are appropriately selected in the down-flow etching apparatus, the resist pattern can be etched at high speed. In addition, the carbon film, and a target material to be etched (e.g., Al, silicon, a silicon oxides film, or a metal film) can be removed at a high selection ratio.

As described above, according to the method of the present invention, since a carbon film is used as a dry etching mask pattern, it is possible to increase the temperature of the target substrate and perform etching at high temperatures. In addition, after etching, the target substrate is annealed at a high temperature before the mask pattern is removed. The side wall of the silicon oxide can be vertically etched, and a high selection ratio to the underlying Si film can be obtained. Furthermore, a pattern having a vertical side wall can be formed without producing residual substances for a material (e.g., copper) having a very low vapor pressure of an etching product.

A material such as tungsten, nickel, titanium, tantalum, a tantalum oxide, strontium titanate, an aluminum oxide, or an aluminum nitride can be accurately etched at a high etching rate with good planar uniformity.

Since high-temperature annealing is performed after etching using a halogen gas is performed but before the mask pattern is removed, degradation of electrical characteristics such as an increase in contact resistance rarely occurs, and a highly reliable device can be manufactured.

EXAMPLE 7

Figure 15:
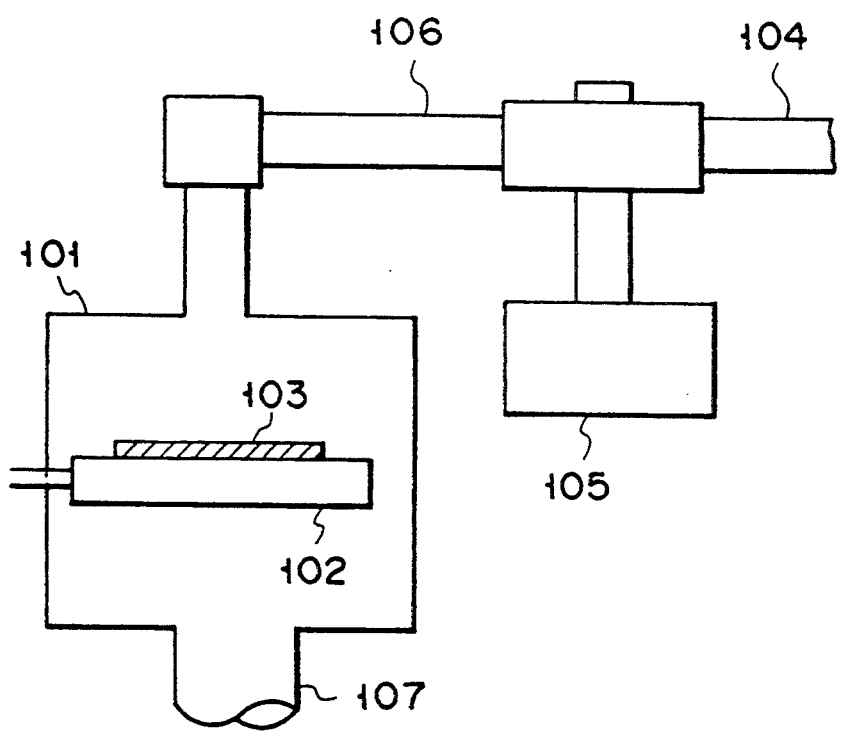
FIG. 15 is a schematic diagram showing an etching apparatus for embodying Example 7 of the present invention.

FIG. 15 is a schematic view showing an apparatus used in Example 7. Reference numeral 101 denotes a reaction chamber. A heater 1O2 is arranged inside the reaction chamber 101. A target object 103 is placed on the heater 102. A supply pipe 104 is connected to the reaction chamber 101 to supply an active spices containing oxygen atoms. A gas containing oxygen atoms or a gas mixture consisting of a gas containing oxygen atoms and a gas containing halogen atoms is supplied from the supply pipe 104, and a discharge tube 106 is connected to a microwave power source 105 and the supply pipe 104 to generate the active species. The reaction chamber 104 is evacuated to a vacuum through an exhaust port 107. A gas mixture of oxygen and $CF_4$ is supplied from the supply pipe 104 in the apparatus (FIG. 15) having the above arrangement to perform etching. The introduced gas is discharged to form neutral radicals, that is, O* in the case of oxygen gas, and O*+F* in the case of a gas mixture of $O_2$ and $CF_4$. These neutral radicals are conveyed to the reaction chamber isolated from plasma, where the substrate is etched. Numeral 8 denotes a wave guide for microwave.

The target object 103 to be etched was an object obtained such that a carbon film (thickness: 20 μm) was formed on an Si substrate or an AlSiCu film formed on an $SiO_2$ formed on an Si substrate, a photoresist (thickness: 1.6 μm) was applied to or coated on the carbon film, and a photoresist pattern was formed using conventional lighographic techniques.

In order to check the etched shape, the carbon film was anisotropically etched by reactive ion etching using oxygen gas as an etching gas and the above photoresist pattern as a mask.

FIG. 16 shows a relationship between etching rates of a resist and a carbon film at a substrate temperature of 25° C. when a mixing ratio of oxygen gas and $CF_4$ gas is changed.

When only oxygen gas was used as an etching gas, neither the resist nor the carbon film were etched. When a small amount of $CF_4$ gas was mixed in the oxygen gas, the etching rate of the resist was increased. When the flow rates of $CF_4$ and $O_2$ were 20 SCCM and 480 SCCM, respectively, the etching rate of the resist was 1,000 Å/min, and the etching rate of the carbon film was 16 Å/min, so that a high selection ratio of 600 was obtained. At this time, the shape of the carbon film was evaluated. The carbon film pattern was not etched at all, and the resist pattern on the carbon film could be perfectly removed.

FIG. 17 shows a relationship between a target object temperature and etching rotes of a carbon film and a resist when oxygen gas is used as an etching gas. As is apparent from FIG. 17, when only oxygen gas or a gas mixture of oxygen and $CF_4$ was used as an etching gas, etching of the carbon film was started from about 100° C., and the etching rate of the carbon film was increased with an increase in temperature of the target object. On the other hand, when only $O_2$ gas is used, etching of the resist was started from about 50° C. Further, when a gas mixture of $O_2$ and $CF_4$ is used, etching of the resist was started from a room temperature (20° C.). Since the carbon film was not heated to 100° C. or more, it was not etched. In down-flow etching using $O_2$ gas, or a gas mixture of a gas containing oxygen atoms and a gas containing halogen atoms such as a gas mixture of $O_2$ and $CF_4$ at a constant substrate temperature of 100° C. or less, only the resist on the carbon film could be removed.

The sectional shape of the target object upon removal of the resist pattern by using the gas mixture of oxygen and $CF_4$ at a constant substrate temperature of 100° C. was evaluated with an SEM. A carbon film pattern was rarely etched, and the resist pattern on the carbon film was perfectly removed.

EXAMPLE 8

Figure 18:
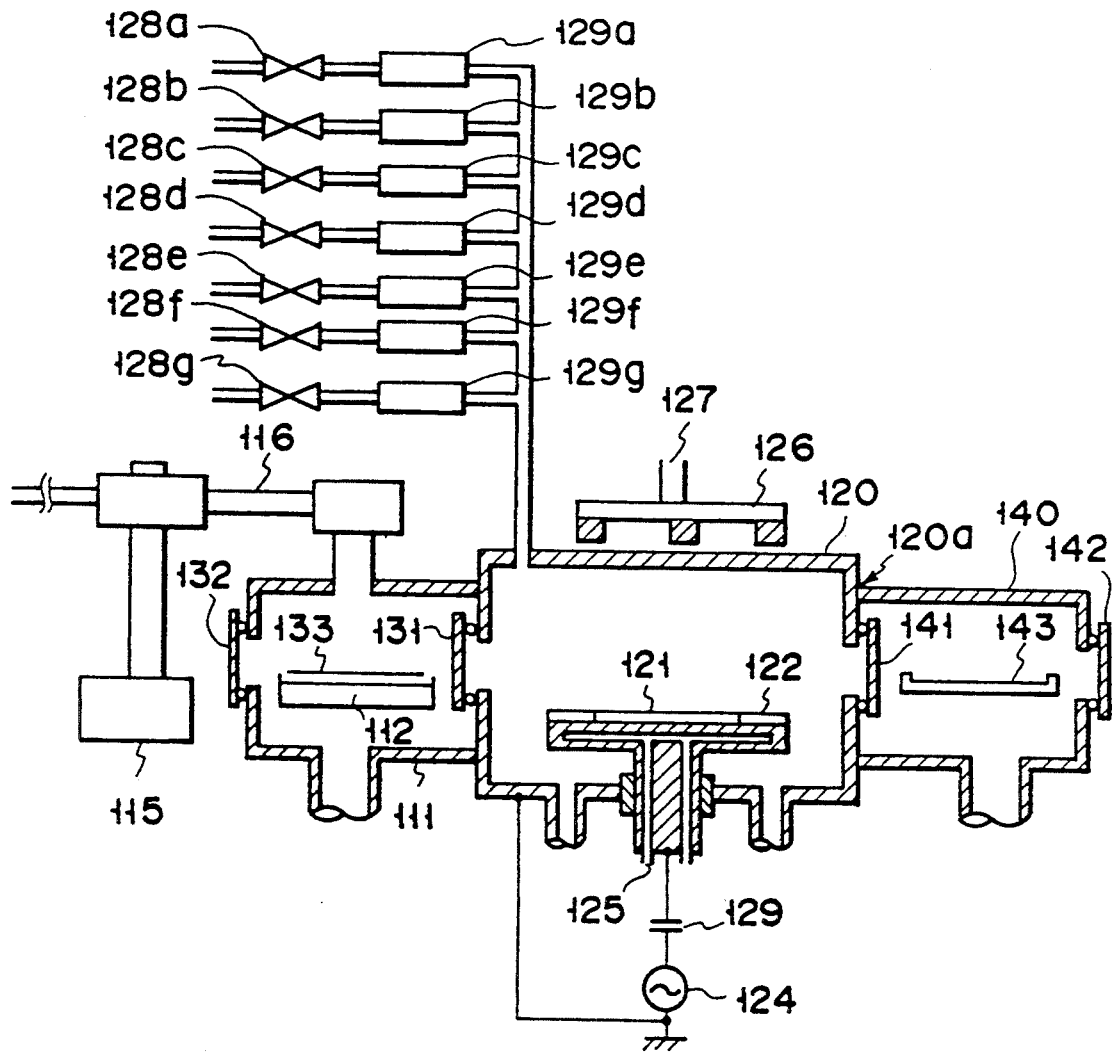
FIG. 18 is a schematic diagram showing an etching apparatus for embodying Example 8 of the present invention.

FIG. 18 is a schematic view of an apparatus used for etching a target object by reactive ion etching, i.e., down-flow etching of Example 8, using a carbon film mask pattern obtained such that a resist is selectively removed from a carbon film to form the carbon film mask pattern.

The apparatus shown in FIG. 18 is obtained by connecting a magnetron built-in reactive ion etching apparatus to the apparatus of FIG. 15.

A dry etching apparatus of this example will be described with reference to FIG. 18.

Reference numeral 111 denotes a reaction chamber. A heater 112 is arranged in the reaction chamber 111 to heat a target object, and a target object 113 is placed on the heater 112. A gas containing oxygen atoms or a gas mixture consisting of the gas containing oxygen atoms and a gas containing halogen atoms is supplied from a pipe 114 for supplying an active species containing oxygen atoms to the reaction chamber, and a discharge tube 116 connected to a microwave power source 115 and the supply pipe 114 generates the active species.

The reaction chamber 111 can be evacuated to a vacuum from an exhaust port 117.

This apparatus is constituted by an etching chamber 120 and an unloading preliminary chamber 140, and the etching chamber 120, the reaction chamber 111, and the unloading preliminary chamber 140 are partitioned by gate valves 131 and 141, respectively. The etching chamber 120 is kept evacuated, a target substrate is loaded from a gate valve 132 arranged in a loading preliminary chamber 130, and the target substrate is unloaded from a gate valve 142 arranged in the unloading preliminary chamber 140, thereby preventing the substrate from being adversely affected by, i.e., humidity or oxygen in the air. In addition, substrate mounting tables 133 and 143 are arranged in the preliminary chambers 130 and 140, respectively.

The etching chamber 120 comprises a first electrode 122 for mounting a target substrate 121 arranged in a vacuum vessel 120a, a high-frequency power source 124 connected through a blocking capacitor 129 for applying a 13.56-MHz high-frequency power to the first electrode 122, and a cooling pipe 125 for cooling the first electrode 122 and controlling the substrate temperature of the target substrate t21 at a predetermined temperature.

While $Cl_2$, $BCl_3$, HBr, $O_2$, $H_2$, and He (At or Kr) are supplied in the vacuum vessel 120a from a chlorine gas ($Cl_2$) supply line 128a, a boron trichloride ($BCl_3$) supply line 128b, a halogen bromide (HBr) supply line 128c, an oxygen gas ($O_2$) supply line 128d, an inert gas (He, At, or Kr) supply line 128e, a hydrogen gas ($H_2$) supply line 128f, and a carbon monoxide gas (CO) supply line 128g, respectively, a RF voltage is applied across the first electrode 122 and the inner wall (upper wall) of the vacuum vessel 120a serving as a second electrode.

At this time, the vacuum vessel 120a is grounded. The gas supply lines 128a to 128g have valves and flow rate adjustors 129a to 129g, respectively, so as to control their flow rates and gas pressures at predetermined values, respectively.

A permanent magnet 126 is arranged above the second electrode portion of the vacuum vessel 120a and eccentrically rotated about a rotating shaft 127 by a motor. A high-density plasma can be produced and maintained by a magnetic field of 50 to 500 gauss generated from the permanent magnet 126 even in a high degree of vacuum of $10^{-3}$ Tort or more. A large amount of ions are extracted from the high-density plasma produced as described above to be radiated on the target substrate 121, thereby etching the target substrate 121.

Etching processes of samples having the following structures were performed using the above dry etching apparatus. The steps in this process are the same as those in FIGS. 4A to 4H and will be described with reference to FIGS. 4A to 4H below.

As shown in FIG. 4A, an $SiO_2$ film was formed on an Si substrate 41, and an AlSiCu (Si concentration: 1 wt %; Cu concentration: 0.5 wt %) thin film 43 was formed on the $SiO_2$ film 42. A carbon film 44 (thickness: 200 nm) was formed on the thin film 43, as shown in FIG. 4B.

As shown in FIG. 4C, a photoresist (thickness: 1.6 μm) was applied to the photoresist 45 on the carbon film 44. The resist 45 was exposed in accordance with the conventional lithographic techniques. As shown in FIG. 4D, the resist 45 was developed to form a resist pattern 45a. In the step of FIG. 4D, an alkaline organic solvent was used as a developing agent. No problem such as elusion or peeling did not occur in the carbon film 44a during development.

Each etching sample was placed on the sample table 121 in the dry etching reaction chamber 120 through the gate valves 132 and 131 in the apparatus shown in FIG. 18.

As shown in FIG. 4E, the carbon film 44 was etched using $O_2$ gas at a constant substrate temperature of $-75°$ C. As etching conditions, the flow rate of $O_2$ gas was set to be 100 SCCM, the pressure was set to be 40 mTorr, and an RF power of 1.7 $W/cm^2$ was applied. The shape of the etched carbon film 44a was observed with an SEM. It was found that the carbon film 44 had almost vertical wall surfaces.

As shown in FIG. 4F, the resist pattern 45a was removed. That is, after the carbon film 44 was etched, the sample was loaded in the down-flow etching reaction chamber 111 in a vacuum through the gate valve 131 and was placed on the sample table 112. A $CF_4/O_2$ gas mixture was used as the etching gas. The flow rate ratio of the $CF_4/O_2$ gas mixture was kept at 20/480 SCCM, and the pressure was kept at 0.3 Tort. The temperature was kept at room temperature, and a microwave was applied to generate an electric discharge, thereby performing etching. As shown in FIG. 4F, the resist pattern was perfectly removed without any residue.

As shown in FIG. 4F, the AlSiCu film 43 was selectively etched using the carbon film 44a as an etching mask. The above dry etching apparatus was used to etch the AlSiCu film 43. That is, the sample was loaded in the dry etching reaction chamber 120 in a vacuum through the gate valve 131 (FIG. 18) again and was placed on the sample table 121.

As etching conditions, the substrate temperature was kept at 50° C., a $Cl_2/BCl_3$ gas mixture (flow rate: 100 SCCM) was used as an etching gas, and CO (flow rate: 20 SCCM) was used as a deposition gas.

An etching pressure was 2.0 Pa, and an RF power density was 0.8 $w/cm^2$ to etch the AlSiCu film 43.

After etching, the sample was loaded in or unloaded from the unloading preliminary chamber 140 through the gate valve 142.

The etched AlSiCu film pattern 43 was observed with an SEM. As shown in FIG. 4G, a 0.4-μm L/S (line and space) pattern was accurately etched.

Finally, as shown in FIG. 4H, the carbon film pattern 44a was etched. A conventional barrel type plasma etching apparatus was used as an etching apparatus, $O_2$ was used as an etching gas, and plasma ashing was performed. It was confirmed that the carbon film pattern 44a was easily removed.

After removal, the AlSiCu pattern 43a was evaluated with an SEM. Even if a gas mixture consisting of $Cl_2$ and $BCl_3$ or a gas mixture consisting of $Cl_2$ and HBr was used, an AlSiCu film having an accurate 0.4-μm/0.4-μm L/S pattern having a tapered shape was found to be formed.

No residue was found on the surface of the AlSiCu film pattern 43a.

The carbon film was dry-etched to obtain a carbon film pattern by using a resist mask and a gas such as $H_2$, an inert gas, or a mixture thereof. Even if any one of the used, was used, the carbon films could be accurately patterned. AlSiCu film patterns 53a obtained by these processes have good shapes without any residue.

An $AlSiCu/TiN/Ti/SiO_2$ thin structure was used as an etching sample and was etched by adding CO. After etching, the sample from which the carbon film pattern was removed was left to stand in air, and the state of corrosion was evaluated with an optical microscope. No corrosion was observed even if the sample was kept left to stand in air for a week.

In this case, a gas used to remove the resist may be a gas mixture consisting of a gas containing oxygen atoms and a gas containing halogen atoms. This etching gas is not limited to $CF_4$, but can be replaced with $SF_6$, FCl, $NF_3$, $C_2H_6$, $C_3F_8$, $BF_3$, $X_2F_6$, or $F_2$.

A means for etching a resist is a method of preventing etching of the carbon film or a method of controlling a substrate temperature. The former method uses a gas mixture consisting of a gas containing steam or at least hydrogen atoms in an active species having halogen atoms.

In Example 8 described above, when the carbon film pattern 44a was removed using the barrel type ashing apparatus upon etching of the AlSiCu film 43. However, when a function of removing the carbon film pattern 44a is provided in the dry etching apparatus shown in FIG. 18, the carbon film pattern 44a can be removed in a vacuum apparatus without exposing it in air.

The method of the present invention described above is not limited to the examples described above. Various changes and modifications may be made without departing the spirit and scope of the invention.

According to the present invention, as has been described above, a resist film can be removed at high speed and a high selection ratio to the carbon film without damaging the target object. In addition, the target object can be patterned at a high selection ratio by using a carbon film pattern mask from which the resist film is removed.

EXAMPLE 9

FIGS. 19A to 19G are sectional views showing the steps in forming an Al-alloy film wiring pattern of a semiconductor device according to Example 9.

Figure 19A:
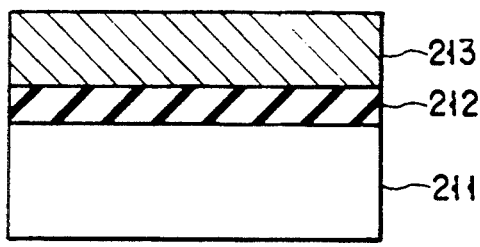
FIGS. 19A to 19G are sectional views showing a method of forming an AlSiCu film wiring layer according to Embodiments 9 and 10.

As shown in FIG. 19A, an $SiO_2$ film 212 is formed on an Si substrate 211, and an AlSiCu (Si concentration: 1 wt %, Cu concentration: 0.5 wt %) thin film 213 (film thickness: 400 nm) is deposited on the $SiO_2$ film 212. Upon completion of deposition of the AlSiCu film 213, in order to improve the adhesion strength of a carbon film to be deposited on the AlSiCu thin film 213, ashing processing is performed to the surface of the AlSiCu film 213 by a normal barrel plasma ashing apparatus using oxygen.

Figure 19B:
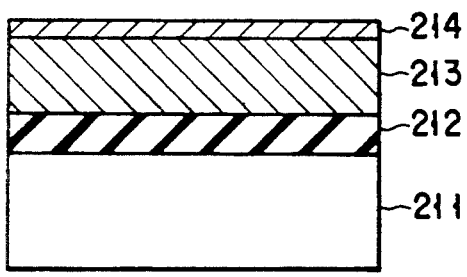

As shown in FIG. 19B, a carbon film 214 (film thickness: 200 nm) is formed on the AlSiCu film 213. The carbon film 214 is deposited on the AlSiCu film 213 by a magnetron sputtering apparatus. A degree of vacuum before the sputtering is on the order of about $10^{-8}$ Torr, and an Ar gas is used as a sputtering gas. After the Ar gas is supplied into the sputtering apparatus to increase the pressure of the sputtering apparatus to $5 \times 10^{-3}$, a high frequency power of 1 kw is applied to the sputtering apparatus. In this manner, a plasma is excited, and a carbon target is sputtered by Ar ions to deposit the carbon film 214 on the AlSiCu film 213. The resultant carbon film consists of carbon having a purity of 99.99% or more, and has an amorphous structure. The thickness of the deposited film, i.e., the carbon film 214, can be changed by changing a sputtering time. In this embodiment, the carbon film 214 is deposited to have a thickness of 200 nm.

Figure 19C:
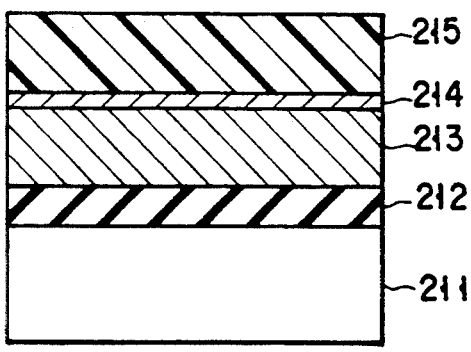
Figure 19D:
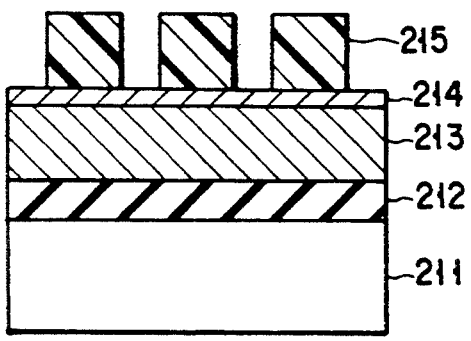

As shown in FIG. 19C, a novolak-based photoresist 215 (film thickness: 1.5 μm) is coated on the carbon film 214 by spin coating, and the photoresist 215 is exposed and developed by normal lithography, thereby forming a photoresist pattern 215 as shown in FIG. 19D.

By using a dry-etching apparatus shown in FIG. 20, the carbon film 214 is selectively etched by RIE using the resist pattern as a mask.

The apparatus shown in FIG. 20 has almost the same structure as that of the apparatus shown in FIG. 18, and is constituted by an etching chamber 220, a supply preliminary chamber 230, and an unloading preliminary chamber 240. The etching chamber 220, the supply preliminary chamber 230, and the unloading preliminary chamber 240 are partitioned from each other by gate valves 231 and 241, respectively. A substrate to be etched is loaded from a gate valve 232 arranged at the unloading preliminary chamber 240 while the etching chamber 220 is kept vacuum, and the substrate to be etched is unloaded from a gate valve 242 arranged at the unloading preliminary chamber 240. For this reason, substrates can be dry-etched one by one in a short time without any adverse influence of atmospheric conditions. Substrate mounting tables 233 and 243 are mounted in the preliminary chambers 230 and 240, respectively.

The etching chamber 220 has an electrode 222 for supporting a substrate 221 to be etched, and the electrode 222 has a cooling pipe 223 for controlling the temperature of the substrate 221 to a desired temperature. In addition, a high-frequency power supply 228 is connected to the electrode 222 through a blocking capacitor 224 and a matching unit 225 to apply a high-frequency power of 13.56 MHz for exciting a plasma to the electrode 222.

An oxygen gas, a $CF_4$ gas, and a $CHF_3$ gas are respectively supplied from an oxygen gas supply line 251a, a $CF_4$ supply line 251b, and a $CHF_3$ supply line 251c into the etching chamber 220. The flow rates of these gases are controlled to predetermined values by valves 252a to 252c and flow rate controllers 253a to 253c.

Figure 19E:
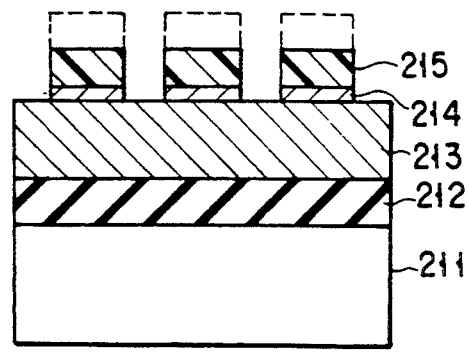

By using the above-described RIE apparatus, as shown in FIG. 19E, a carbon film 214 serving as a material to be etched is dry-etched by various gases using the photoresist pattern 215 as a mask. The etching characteristics of the resultant carbon film were examined.

Figure 21A:
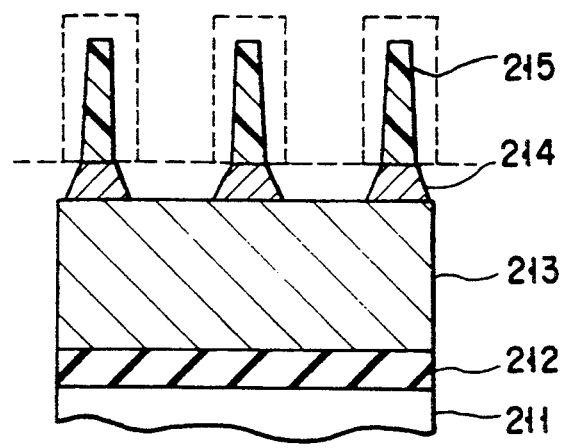
FIGS. 21A and 21B are sectional views showing a method of forming a mask pattern of a carbon film according to the prior art.

The well-known RIE using only an oxygen gas was performed. As etching conditions, an flow rate was 100 SCCM, the pressure of the etching chamber 220 was 50 mTorr, a high-frequency power was 1.7 w/cm², and the electrode 222 was cooled to a temperature of -20° C. Under these etching conditions, although the carbon film 214 was etched at an etching rate of about 300 nm/min, the photoresist 215 was etched at an etching rate of about 1,200 nm/min, and the selection ratio of the carbon film 214 to the photoresist 215 was about 0.4. when the sectional shape of an etched carbon film pattern 214 was observed with an SEM (Scanning Electron Microscope), a resist pattern had a wiring width of about 0.4 μm and a wiring interval of about 0.4 μm, the edge of the carbon film pattern 214 had a taper angle of about 58° as shown in FIG. 21A, a dimensional change of a pattern was +0.2 μm (note that the widening direction of the carbon film 214 is represented by "+", and the narrowing direction of the carbon film 214 is represented by The above large dimensional change occurred because an opening of the resist was widened due to the small etching selectivity of the carbon film to the resist and a large side-etching amount of the photoresist 215. Since the size of the mask pattern of the carbon film 214 was decreased, the wiring width after etching of the AlSiCu film 213 (to be described later) was smaller than an initially designed width to decrease a maximum allowable current value, and the wiring layers were often disconnected during an operation of the semiconductor device, thereby degrading the reliability of the semiconductor device.

Figure 21B:
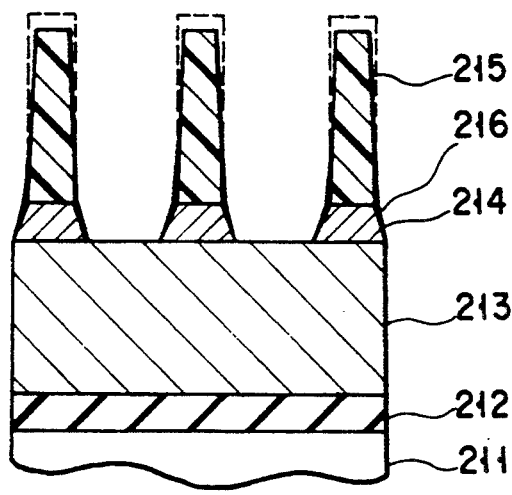

RIE was performed using a $CF_4$ gas serving as a compound of carbon and fluorine. Etching conditions were the same as those of the RIE using only an oxygen gas. Under the etching conditions, while the carbon film 214 was etched at an etching rate of about 180 nm/min, the photoresist 215 was etched at an etching rate of about 500 nm/min, and the etching selectivity of the carbon film 214 to the photoresist 215 was about 0.6. When the sectional shape of the carbon film pattern 214 was observed with an SEM, as shown in FIG. 21B, the edge of the carbon film pattern 214 had a taper angle of about 85°, the resist pattern had a wiring width of 0.4 μm and a wiring interval of 0.4 μm, and a pattern transfer difference was about −0.08 μm.

Since the size of the mask pattern of the carbon film 214 was increased, a wiring interval after the etching of the AlSiCu film 213 (to be described later) was smaller than an initially designed width, insulation resistances between the wiring layers were decreased, and the wiring layers were often short-circuited to each other during an operation of the semiconductor device, thereby degrading the reliability of the semiconductor device. However, the selectivity of the etching rate of the carbon film to the etching rate of the resist was increased, the taper angle of the edge of the carbon film pattern 214 was close to a right angle, and the size of the opening of the resist was decreased unlike the case wherein the carbon film 214 was etched by an oxygen gas. This phenomenon may occur because a side-wall protecting film 216 consisting of $CF_x$ (fluorocarbon) is deposited on the side walls of the carbon film pattern 214 during the RIE.

Therefore, the present inventors considered that the taper angle of the edge of the carbon film pattern 214 could be controlled by balancing a side-wall protecting film forming effect. By the $CF_4$ gas and a sideetching effect by an oxygen gas. More specifically, RIE was performed using a gas mixture whose mixing ratio of the $CF_4$ gas to the oxygen gas was changed while a total flow rate was kept constant, thereby balancing the above effects.

Figure 22:
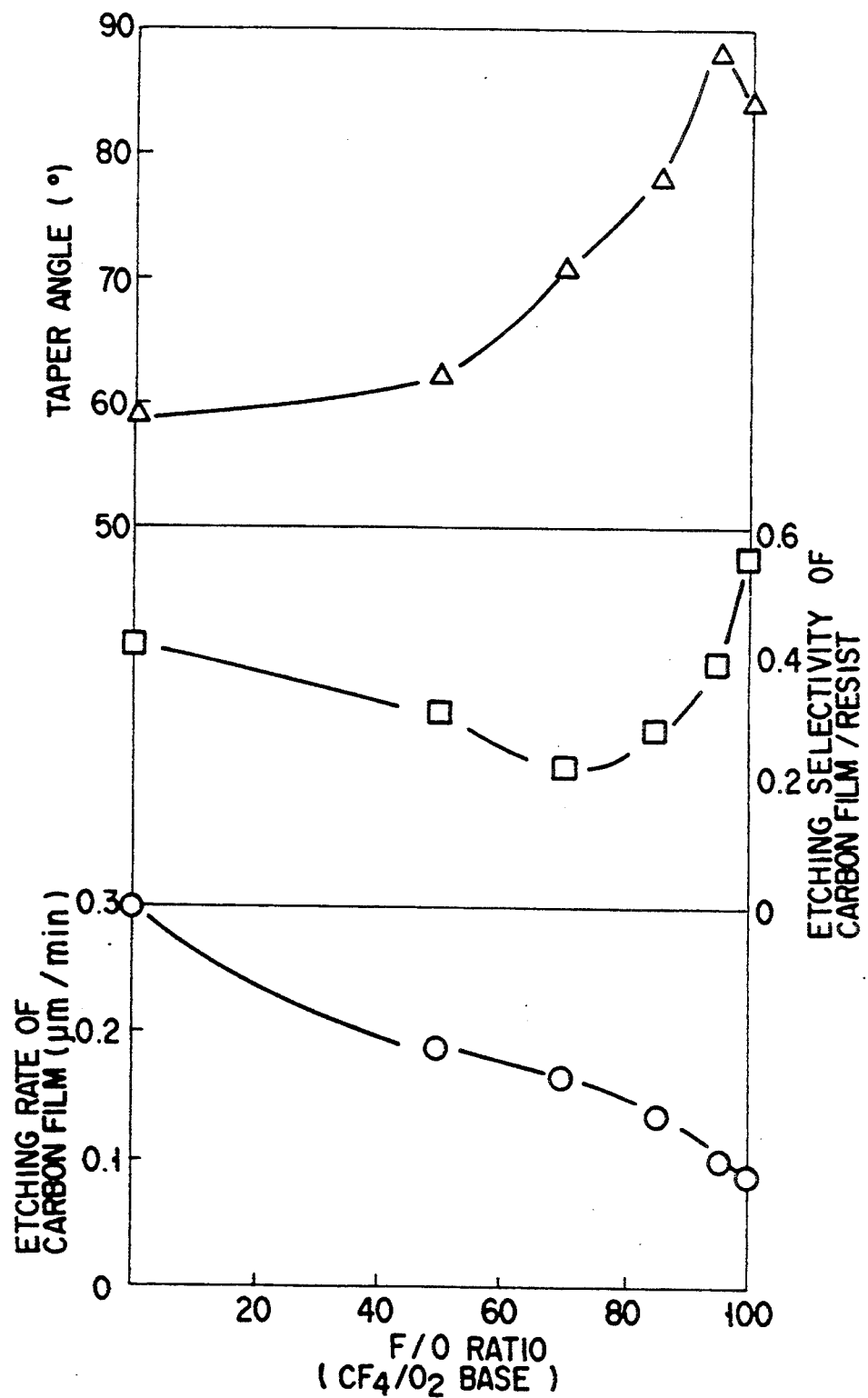
FIG. 22 is a graph showing the etching rates of a carbon film and a resist, the selection ratio of the etching rate of the carbon film to the etching rate of the resist, and the taper angle of the edge of a carbon film pattern as a function of an F/O ratio when $CF_4$ and oxygen gases of Embodiment 9 are used.

FIG. 22 is a graph showing the etching rates of the carbon film 214 and the photoresist 215, the selectivity of the etching rate of the carbon film 214 to the etching rate of the photoresist 215, and the taper angle of the edge of carbon film pattern as a function of a $CF_4$ gas flow rate % (the $CF_4$ gas flow rate (SCCM) with respect to the mixture gas flow rate of 100 SCCM) when RIE is performed while the mixing ratio of the $CF_4$ gas to the oxygen gas is changed.

As is apparent from FIG. 22, when the flow rates of the $CF_4$ gas and oxygen gas were set to be 90 SCCM and 10 SCCM, respectively, the carbon film 214 could be almost vertically etched at a taper angle of about 89°, and the dimensional change could be minimized. At this time, other etching conditions such as the pressure of the etching chamber 220 were the same as those in the above etching which was performed using only an oxygen gas or only $CF_4$ gas. In this case, although the carbon film 214 was etched at an etching rate of about 200/min, the photoresist 215 was etched at an etching rate of about 500 nm/min, and the selectivity of the etching rate of the carbon film 214 to the etching rate of the photoresist 215 was about 0.6.

Under the above etching conditions of the carbon film 214, since the etching rate of the AlSiCu thin film 213 serving as an underlying layer was as low as about 10 nm/min, a decrease in thickness of the AlSiCu film 213 was very small, and the surface of the AlSiCu film 213 was kept smooth as in the state prior to etching.

As described above, when etching is performed in an atmosphere of a gas mixture of a $CF_4$ gas and an oxygen gas, since the carbon film 214 can be almost vertically etched, a dimensional change from the resist can be decreased. For this reason, Ca carbon film mask having a wiring line width and a wiring interval which are faithful to a resist pattern, i.e., an initial design can be formed.

Figure 19F:
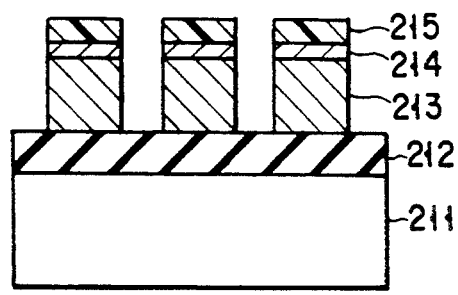

In this manner, after the carbon film 214 was formed as a highly accurate mask pattern, the AlSiCu film 213 was selectively etched using the photoresist 215 and the carbon film 214 as etching masks as shown in FIG. 19F. The AlSiCu film 213 was etched by an etching apparatus having the same arrangement as that of the above dry-etching apparatus shown in FIG. 20. However, a gas mixture of a $Cl_2$ (chlorine) gas and a $BCl_3$ (boron trichloride) gas was used as an etching gas.

As etching conditions, the flow rates of the $Cl_2$ gas and the $BCl_3$ were 30 SCCM and 40 SCCM, respectively, the pressure of the etching chamber was 20 mTorr, an applied high-frequency power was 0.8 $W/cm^2$ and an electrode temperature was kept at 50° C. At this time, the etching rate of the AlSiCu film 213 was about 370 nm/min, and the etching rate of the carbon film 214 was about 35 nm/min, the selectivity of the etching rate of the AlSiCu thin film 213 to the etching rate of the carbon film 214 was about 10. On the other hand, the selectivity of the etching rate of the AlSiCu thin film 213 to the etching rate of the photoresist 215 was about 1.5.

Therefore, when the etching of the AlSiCu thin film 213 was finished, and wiring layers were formed, the photoresist 215 was almost removed. However, since the selection ratio of the carbon film 214 was as large as 10, the carbon film pattern 214 was used as the etching mask.

Figure 19G:
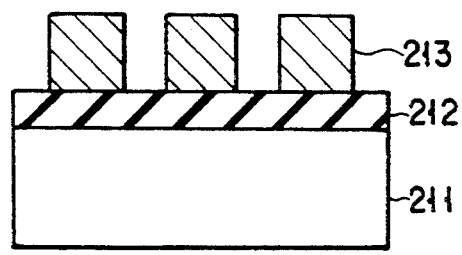

Finally, as shown in FIG. 19G, the photoresist pattern 215 and the carbon film pattern 214 were removed by a normal barrel plasma ashing apparatus. When ashing processing was performed by the same oxygen plasma as that used in normal resist peeling, the photoresist pattern 215 and the carbon film pattern 214 were removed, an AlSiCu wiring layer pattern 213 having a wiring width and a wiring interval which was faithful to the initial design was formed.

In the etching of the carbon film described in the above embodiment, a ratio of the flow rate of the $CF_4$ gas to the flow rate of the oxygen gas is set to be 90 SCCM: 10 SCCM. As this ratio, any ratio for decreasing a pattern transfer difference may be used, and another predetermined ratio may be used to control a taper angle and a pattern transfer difference.

As etching conditions for the RIE of the carbon film, a ratio of the flow rate of a $CF_4$ gas to the flow rate of an oxygen gas is 99:1 to 3:7, more preferably, 95:5 to 5:5, and most preferably, 9:1 (the total flow rate: 50 SCCM to 300 SCCM), the pressure of the etching chamber 220 is 10 Torr to 500 mTorr, a high-frequency power is 100 W to 1 kW, and an electrode temperature is −100° C. to 80° C.

EXAMPLE 10

As in Example 9, as shown in FIG. 19A, an $SiO_2$ film 212 is formed on an Si substrate 211, and an AlSiCu thin film 213 is deposited on the $SiO_2$ film 212. Plasma ashing processing is performed using an oxygen gas. As shown in FIG. 19B, a carbon film 214 (film thickness: 200 nm) is formed on the AlSiCu thin film 213.

As shown in FIG. 19C, a novolak-based photoresist 215 (film thickness: 1.5 μm) is coated on the carbon film 214 by spin coating, and the photoresist 215 is exposed and developed by normal lithography, thereby forming a photoresist pattern 215 as shown in FIG. 19D.

By using the photoresist pattern 215 as a mask, RIE is performed using a $CHF_3$ gas consisting of carbon, hydrogen, and fluorine atoms. In the RIE, etching conditions such as gas flow rates were the same as those of the RIE described in Example 9 and using an oxygen gas and a $CF_4$ gas. Under the etching conditions, although the carbon film 214 was etched at an etching rate of about 70 nm/min, the photoresist 215 was etched at an etching rate of about 120 nm/min, and the selectivity of the etching rate of the carbon film 214 to the etching rate of the photoresist 215 was about 0.6. When the sectional shape of an etched carbon film pattern 214 was observed with an SEM, the taper angle of the edge of the carbon film pattern 214 was about 82°, a resist pattern had a wiring width of 0.4 μm and a wiring interval of 0.4 μm, and a dimensional change was −0.1 μm.

In this case, as in Example 9, RIE was performed while a mixing ratio of a $CHF_3$ gas and oxygen gas was changed to control the etching shape of the carbon film pattern 214.

FIG. 23 shows the etching rates of the carbon film 214 and the photoresist 215, the selectivity of the etching rate of the carbon film 214 to the etching rate of the photoresist 215, and the taper angle of the edge of the carbon film pattern when RIE is performed while a mixing ratio of the $CHF_3$ gas and the oxygen gas is changed.

Etching was performed under the following conditions. That is, the flow rates of the $CHF_3$ gas and the oxygen gas were 75 SCCM and 25 SCCM, respectively, the pressure of an etching chamber 220 was 50 mTorr, a high-frequency application power was 1.7 w/cm², and an electrode temperature was 20° C. In this case, when the sectional shape of the carbon film pattern 214 was observed with an SEM, it was found that the edge of the carbon film pattern 214 was almost vertically etched at a taper angle of 89° as shown in FIG. 19E.

Under the above etching conditions, although the carbon film 214 was etched at an etching rate of about 90 nm/min, the resist 215 was etched at an etching rate of about 160 nm/min, and the selectivity of the etching rate of the carbon film 214 to the etching rate of the photoresist 215 was about 0.55.

Under the etching, conditions of the carbon film 214, the etching rate of the AlSiCu film 213 serving as an underlying layer was about 8 nm/min, a decrease in thickness of the AlSiCu film 213 was very small, and the surface of the AlSiCu film 213 was kept smooth as in the state prior to etching.

In addition, since the carbon film pattern 214 was almost vertically etched., a dimensional change could be minimized. For this reason, a carbon film mask having a wiring width and a wiring interval which were faithful to the resist pattern, i.e., the initial design, could be formed.

As described above, the carbon film pattern 214 was formed as a highly accurate mask pattern, and the AlSiCu film 213 was etched using the resist pattern 215 and the carbon film pattern 214 as shown in FIG. 19F as in Examples 9 and 10. As a result, when the etching of the AlSiCu film 213 was finished, although the resist 215 was almost removed, the carbon film 214 having a sufficiently large selectivity effectively served as the etching mask at last.

Finally, as shown in FIG. 19G, the photoresist pattern 215 and the carbon film pattern 214 were removed by a normal barrel plasma ashing apparatus. When ashing processing was performed in the same oxygen plasma as that performed for normal resist peeling, the photoresist pattern 215 and the carbon film pattern 214 were removed, an AlSiCu film wiring layer pattern 213 having a wiring width and a wiring interval which were faithful to the initial design.

In the above-described etching of the carbon film, the flow rates of the $CHF_3$ gas and the oxygen gas are 75 SCCM and 25 SCCM, respectively. However, any rate for decreasing a dimensional change may be used, and a ratio of the flow rates may be arbitrarily determined to control a taper angle and a dimensional change.

As etching conditions for the RIE of the carbon film, a ratio of the flow rate of a $CHF_3$ gas to the flow rate of an oxygen gas is 9:1 to 25:75 (total flow rate: 50 SCCM to 300 SCCM), the pressure of the etching chamber 220 is 10 mTorr to 500 mTorr, a high-frequency power is 100 W to 1 kw, and an electrode temperature is −100° C. to 80° C.

In addition, when an experiment was performed by a gas mixture of an oxygen gas and various gases containing fluorine, a taper angle varies with the mixing ratio. Although the mixing ratio depended on the types of various gases containing fluorine, as a matter of course, it was found that the carbon film could be almost vertically etched at a right angle.

Similarly, the taper angle varied by using a CO (carbon monoxide) gas in place of the oxygen gas, and it was found that the carbon film could be almost vertically etched.

Therefore, in Examples 9 and 10, any gas mixture containing at least fluorine and oxygen can be used as a gas used for controlling the sectional shape of the carbon film pattern 214.

The above-described etching of the AlSiCu film in Examples 9 and 10 is performed using a gas mixture of a $BCl_3$ gas and a chlorine gas. However, any chlorine-based gas can be used as the gas mixture, and the pressure of the etching chamber, the high-frequency application power, and the like may be changed. Further, the material constituting the substrate to be etched may be SiN, polycrystalline silicon, W, Cu, TiN, Ti, $Ta_2O_5$, $Nb_2O_5$, $SiTiO_3$ or $BaTiO_3$.

EXAMPLE 11

An example wherein a contact hole is formed by forming an opening in an $SiO_2$ film interposed between conductive wiring layers and a substrate described in Examples 9 and 10 will be described below with reference to FIGS. 24A to 24G.

Figure 24A:
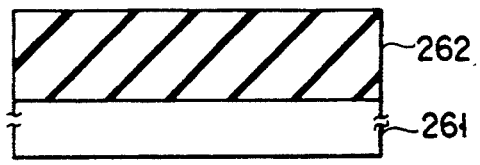
FIGS. 24A to 24G are sectional views showing a method of forming a contact hole according to Embodiment 11.

An impurity is doped in an Si substrate 261 to form a diffusion layer. As shown in FIG. 24A, an SiO$_2$ film 262 is deposited on the Si substrate 261 by CVD (Chemical vapor Deposition) to have a thickness of about 1 μm.

Figure 24D:
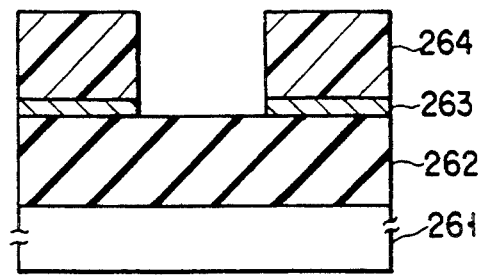
Figure 24B:
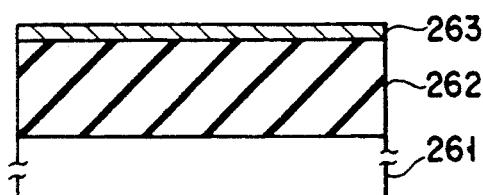

As shown in FIG. 24B, a carbon film 263 (film thickness: 200 nm) is formed on the SiO$_2$ film 262. In addition, as described in Examples 9 and 10, a novolak-based photoresist 264 (film thickness: 1.5 μm) is coated on the carbon film 263 by spin coating, and the photoresist 264 is exposed and developed by normal lithography, thereby forming a photoresist pattern 264 as shown in FIG. 24C.

After the photoresist patterning, as in Examples 9 and 10, as shown in FIG. 24D, the carbon film 263 is vertically etched using a gas mixture of a CF$_4$ gas and an oxygen gas and a gas mixture of a CHF$_3$ gas and an oxygen gas. Note that etching conditions such as the pressure of an etching chamber and a high-frequency power are the same as those described in Examples 9 and 10.

Under the etching conditions for the carbon film 263, the etching rate of the SiO$_2$ film 262 serving as an underlying layer was about 120 nm/min when the gas mixture of a CF$_4$ gas and an oxygen gas was used, and the etching rate was about 90 nm/min when the gas mixture of a CHF$_3$ gas and an oxygen gas was used. Upon completion of the etching, in any case, although the thickness of the SiO$_2$ film 262 was slightly decreased, no deposits could be observed on the surface of the etched SiO$_2$ film 262, and the smooth surface could be obtained.

Figure 24E:
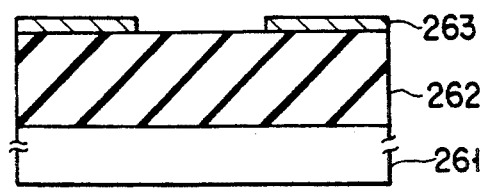
Figure 24C:
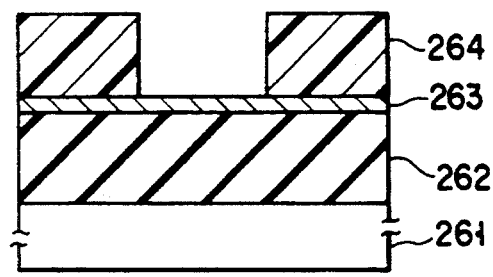

As shown in FIG. 24E, the residual resist 264 is removed by down-flow ashing using a gas mixture of a CF$_4$ gas and an oxygen gas.

Figure 24F:
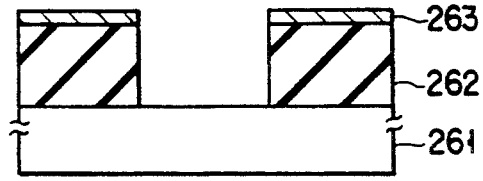
Figure 24G:
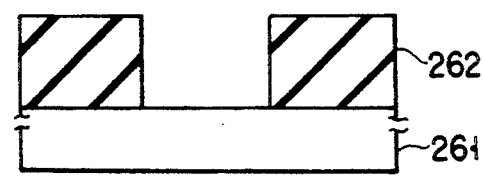

As shown in FIG. 24F, the SiO$_2$ film 262 is dryetched using the magnetron RIE apparatus described in Examples 9 and 10. In this case, a gas mixture of a CHF$_3$ gas and a CO gas was used as an etching gas, the flow rates of the CHF$_3$ and the CO gas were 150 SCCM and 50 SCCM, respectively, a high-frequency power was 1.4 W/cm$^2$, the pressure of an etching chamber 220 was 40 mTorr, and the temperature of an electrode table was 150° C.

When etching was performed while the substrate temperature was gradually increased, and a change in shape of a contact hole of the SiO$_2$ film 262 was observed with an SEM, it was found that the sectional shape of the contact hole was changed from a tapered shape into a vertical shape in accordance with an increase in substrate temperature. Therefore, the substrate temperature is heated to 150° C. to vertically form a contact hole and to allow a micropatterned and highly accurate wiring pattern to be connected to the substrate. For comparison, when the SiO$_2$ film 262 was etched under the above conditions using a resist as a mask without using a carbon film, the resist pattern was deformed due to heat, and a desired contact hole which was faithful to the initial design could not be formed.

When the substrate temperature was lower than 150° C., a vertical shape could be obtained. In addition, the selectivity of the etching rate of the resist to the etching rate of the SiO$_2$ film was as low as about 15, and an aspect ratio of the thickness of the resist to the diameter of the hole was as large as 3 or more, at a position where a contact hole had a diameter of 400 nm. Therefore, the thickness of the SiO$_2$ was 1 μm or more, it was observed that the etching was stopped at the middle of the SiO$_2$ film 262.

On the other hand, when a carbon film was used as a mask, the Selectivity of the etching rate of the SiO$_2$ film to the etching rate of the carbon film was as high as 20 or more, and the thickness of the carbon film could be set to be 200 nm or less (aspect ratio: 0.5 or less) with respect to the contact hole diameter of 400 nm. After the carbon film was vertically formed, the substrate temperature was kept at 150° C., and the SiO$_2$ layer was dry-etched. In this manner, even when the thickness of the SiO$_2$ layer was 1 μm, a vertical contact hole could be formed in the SiO$_2$ layer without interrupting etching.

After the contact hole was formed, the carbon film 263 was removed by a normal barrel plasma ashing apparatus. When ashing processing was performed in the same oxygen plasma as that for normal resist peeling, the carbon film 263 was removed, and a vertical contact hole 257 having a diameter faithful to the design could be formed.

In the etching of the SiO$_2$ film 262 described in Example 11, the gas mixture of a CHF$_3$ gas and a CO gas is used as an etching gas. However, a halogen-based gas such as a gas mixture of a CF$_4$ and a hydrogen gas, or a rare gas such as Ar can be used as the etching gas.

In Examples 9 to 11 described above, the carbon film, AlSiCu film, and SiO$_2$ film are etched by using a magnetron RIE apparatus having a parallel-plate electrode structure. However, the following various plasma etching apparatuses may be used: a normal magnetless RIE apparatus; a dry-etching apparatus having a structure in which a microwave is applied to generate ECR (Electron Cyclotron Resonance), to produce a plasma, and to apply a bias potential to a substrate to be etched; a dry-etching apparatus having a structure in which an electron beam is applied to produce a plasma and to apply a bias potential to the substrate to be etched; and a dry-etching apparatus having a structure in which a high-frequency wave having a frequency lower than an ECR frequency is applied in an etching chamber to produce a plasma and to apply a bias potential to the substrate to be etched. In this case, the etching conditions such as the pressure in the etching chamber and the high-frequency application power for the carbon film, AlSiCu film, and SiO$_2$ film in Examples 9 to 11 may be changed in accordance with the structures of the apparatuses.

In addition, in Examples 9 to 11, sputtering is used as a method of forming a carbon film. However, vacuum deposition or CVD may be used, and the thickness of the deposited carbon film is not necessarily set to be 200 nm.

In Examples 9 to 11, the carbon film consists of carbon having an amorphous structure. However, the carbon film may consist of graphite or carbon having a diamond structure.

Note that, in Examples 9 to 11, although a novolak-based resist is used, any resist which can be photosensitive to visible light, an ultraviolet ray, an X-ray, or an electron beam and developed to form a pattern may be used.

As has been described above, in Examples 9 and 10, a carbon film is etched using a resist pattern as a mask to form a carbon film pattern, and the carbon film pattern is used as a mask for dry-etching an AlSiCu film. In Examples 11, although a carbon film pattern is formed as a mask for a contact hole in an SiO$_2$ film, the carbon film may be applied to various steps in each processing performed using a resist pattern during the manufacture of a semiconductor device, e.g., the step of forming an n+-poly-Si thin film on a gate electrode and the step of forming a trench device in an Si substrate. In addition, the carbon film pattern may be used in a method except for the method of manufacturing a semiconductor device.

As described above, according to Examples 9 to 11, when etching is performed in the atmosphere of a gas mixture of a fluorine gas and an oxygen gas, a carbon film can be almost vertically etched. Therefore, a dimensional change between the carbon film and a resist can be minimized, and a carbon mask having a wiring width and a wiring interval which are faithful to the resist pattern, i.e., the design, can be formed. That is, a highly accurate carbon film mask can be formed, and the etching processes using the carbon film mask can be practically used for the first time.

EXAMPLE 12

FIG. 25 is a view showing a schematic arrangement of an etching apparatus used in Example 12.

A substrate 301 and a heater 303 for heating the substrate 301 are stored in a reaction chamber 302. An etching gas supply portion 307 storing an $O_2$ gas and a $CF_4$ gas is connected to the upper portion of the reaction chamber 302 through a gas supply pipe 304, a discharge pipe 305, and a gas supply pipe 306. A microwave power supply 308 is connected between the discharge pipe 305 and the gas supply pipe 306. On the other hand, a gas exhausting portion (not shown) is formed in the lower portion of the reaction chamber 302.

Patterning of a metal film using an etching apparatus having the above arrangement will be described below with reference to FIGS. 26A to 26E which are the sectional views showing the steps in patterning the metal film.

Figure 26A:
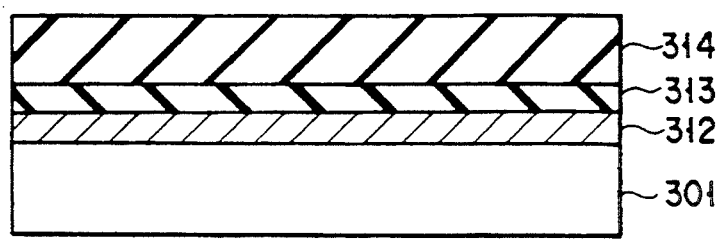
FIGS. 26A to 26E are sectional views showing the steps in patterning an Al film in Embodiment 12.
Figure 26B:
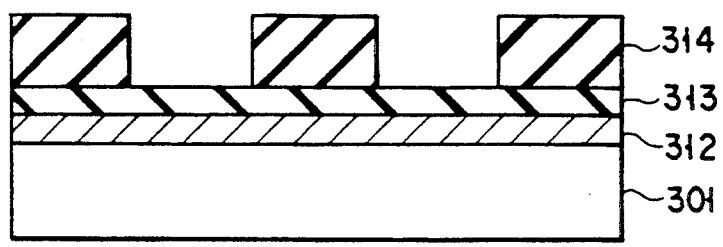

As shown in FIG. 26A, a metal film 312 is deposited on the desirably processed substrate 301. After a carbon film 313 is deposited on the metal film 312, a photoresist 314 is coated on the carbon film 313. Thereafter, as shown in FIG. 26B, after the photoresist 314 is exposed in a desired pattern by using light and an ultraviolet ray, the photoresist 314 is developed to form a resist pattern 314.

Figure 26C:
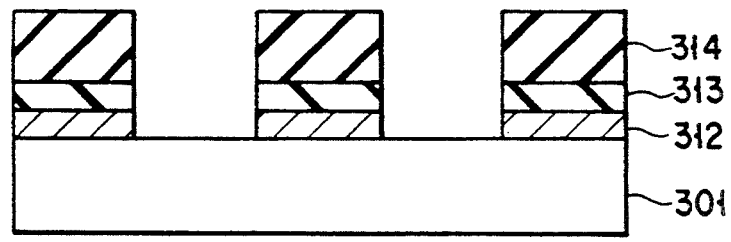

As shown in FIG. 26C, the carbon film 313 and the metal film 312 are selectively etched using the resist pattern 314 as a mask. After the substrate 301 is loaded in the reaction chamber 302 of the etching apparatus in FIG. 25, a gas in the reaction chamber 302 is exhausted from the gas exhausting portion, and the pressure of the reaction chamber 302 is decreased to a predetermined level, e.g., about 0.4 to 0.7 Torr. Thereafter, the substrate 301 is heated by the heater 303, and the substrate temperature is kept at a temperature of less than 100° C., e.g., 40° to 65° C.

Figure 26D:
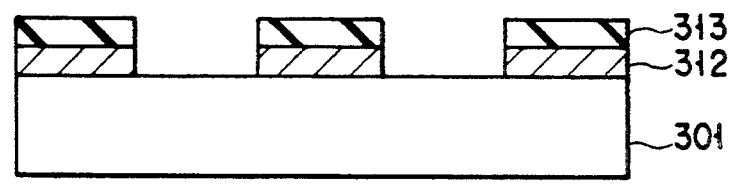

The valve of the etching gas supply portion 307 is opened, and the microwave power supply 308 is turned on. As a result, $O_2$ ($O_2$ radicals) and $CF_4$ ($CF_4$ radicals) excited in the discharge pipe 305 are supplied into the reaction chamber 302 through the gas supply pipe 304, and, as shown in FIG. 26D, the photoresist 314 is selectively removed by radicals with down-flow etching using $O_2$ and $CF_4$ radicals. The photoresist 314 is selectively removed because the etching rate of the carbon film is sufficiently low at low temperatures.

That is, according to the studies of the present inventors, it was found that a carbon film was not burned at a temperature of 600° to 700° C. in an oxygen atmosphere, but, in the atmosphere of oxygen radicals, the carbon film reacted with the oxygen radicals at 100° C. or more and could be removed. In addition, even when other radicals, e.g., a radical mixture of the oxygen radicals and radicals of a halogen such as fluorine, was used, it was found that the same effect as described above could be obtained.

Figure 27:
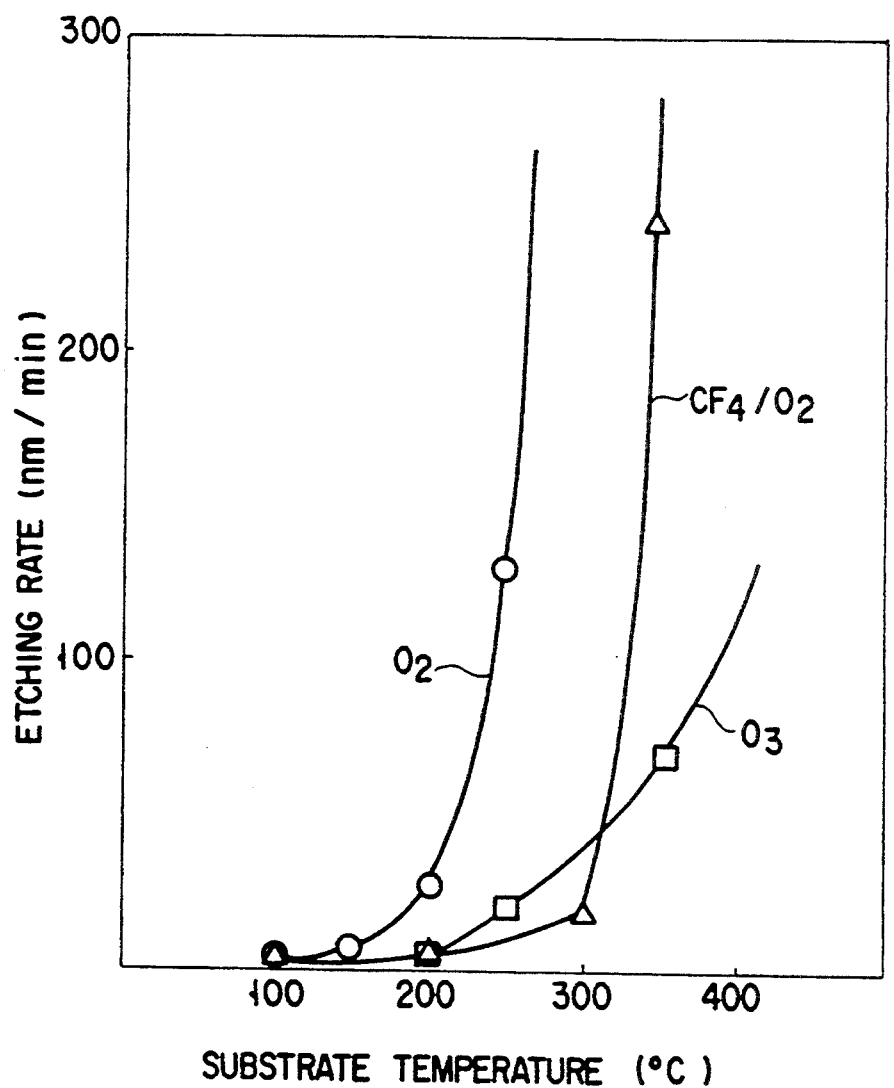
FIG. 27 is a graph showing a relationship between the etching rate of a carbon film and a substrate temperature.

FIG. 27 shows measurement values representing the above studies, and is a graph showing relationships between a substrate temperature and the etching rates of carbon films respectively obtained in an $O_2$ gas, an $O_3$ gas, and a gas mixture of a $CF_4$ gas and an $O_2$ gas by using the etching apparatus in FIG. 25. In this measurement, the flow rate of the $O_2$ gas was 100 SCCM, the flow rate of the $O_3$ gas was 300 SCCM. In addition, the $CF_4$ gas of the gas mixture was 25 SCCM, and the $O_2$ gas of the gas mixture was 75 SCCM. Note that only the $O_3$ gas was not used as radicals.

According to FIG. 27, when the $O_2$ gas and the gas mixture of the $CF_4$ gas and the $O_2$ gas are used as source gases for radicals, the carbon film begins to be etched when the substrate temperature becomes 100° C. or more. Therefore, it is found that the etching rate of the carbon film is increased in accordance with an increase in substrate temperature.

Therefore, when the substrate temperature is set to be less than 100° C., only the resist pattern 314 can be selectively removed. In addition, when the $O_3$ gas was used, the carbon film begun to be etched when the substrate temperature became 200° C. or more. However, when an $O_3$ radical gas was used, the same result as that obtained by using the $O_2$ gas as a source gas could be obtained.

Figure 26E:
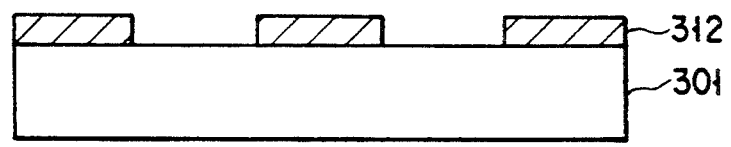

Finally, at a predetermined pressure, e.g., 0.4 to 0.7 Torr, the substrate 301 is heated using the heater 303 to a temperature ranging from 100° C. to 500° C., preferably 100° C. to 300° C., to increase the etching rate of the carbon film. As shown in FIG. 26E, the carbon film 313 is removed, thereby completing the steps in patterning the metal film 312.

According to the above method, since the carbon film 313 can be removed without using ions, the metal film 312 can be patterned without any damage to the underlying layer of the metal film 312. In addition, according to Example 12, even when the substrate 301 is not heated to a temperature of more than 500° C., the carbon film 313 can be removed. Therefore, the method can be applied to patterning of a metal film consisting of a material such as aluminum having a low melting point. In contrast to this, when a metal consisting of a refractory material is to be patterned, since a carbon film can be heated to high temperatures, the carbon film can be removed for a short time.

Even when the substrate 301 is a large-diameter wafer, since oxygen radicals as of an $O_2$ gas or $O_3$ gas have a long life, a large amount of oxygen radicals can be supplied to the reaction chamber 302, and the carbon film 313 can be uniformly etched. In addition, since the carbon film 313 is removed at a substrate temperature of 100° C. or more, the residual elements of the photoresist pattern 314 can be evaporated. Therefore, after the carbon film 313 is removed, the residual elements of the photoresist pattern 314 are not left on the metal film 312 serving as the underlying layer. 10 In Example 12, although the gas mixture of an $O_2$ gas and a $CF_4$ gas is used as a source gas for a radical, other source gases consisting of F, e.g., an $SF_6$ gas, an $NF_3$ gas, a $CF_4$ gas, a $C_2F_6$ gas, a $C_3F_8$ gas, a $BF_3$ gas, an $XeF_2$ gas, and an $F_2$ gas may be used. In addition, a source gas consisting of halogen other than fluorine and an $O_2$ gas may be used.

Only an $O_2$ gas may be used in place of the gas mixture. In this case, as shown in FIG. 27, an etching rate higher than that obtained when the gas mixture is used can be obtained. For example, when etching is performed at a substrate temperature of 250° C. using the carbon film 313 having a thickness of 40 nm, an etching rate of 130 nm/min can be obtained, and the carbon film 313 can be removed for a short time, i.e., about 20 seconds.

EXAMPLE 13

A different point between a method of removing a carbon film according to Example 13 and that of Example 12 is that the carbon film pattern and a photoresist pattern are simultaneously removed.

That is, a substrate temperature is set to be a temperature at which the photoresist pattern and the carbon film pattern can be simultaneously removed, and the photoresist pattern and the carbon film pattern are simultaneously removed by down-flow etching using $O_2$ radicals.

Figure 28:
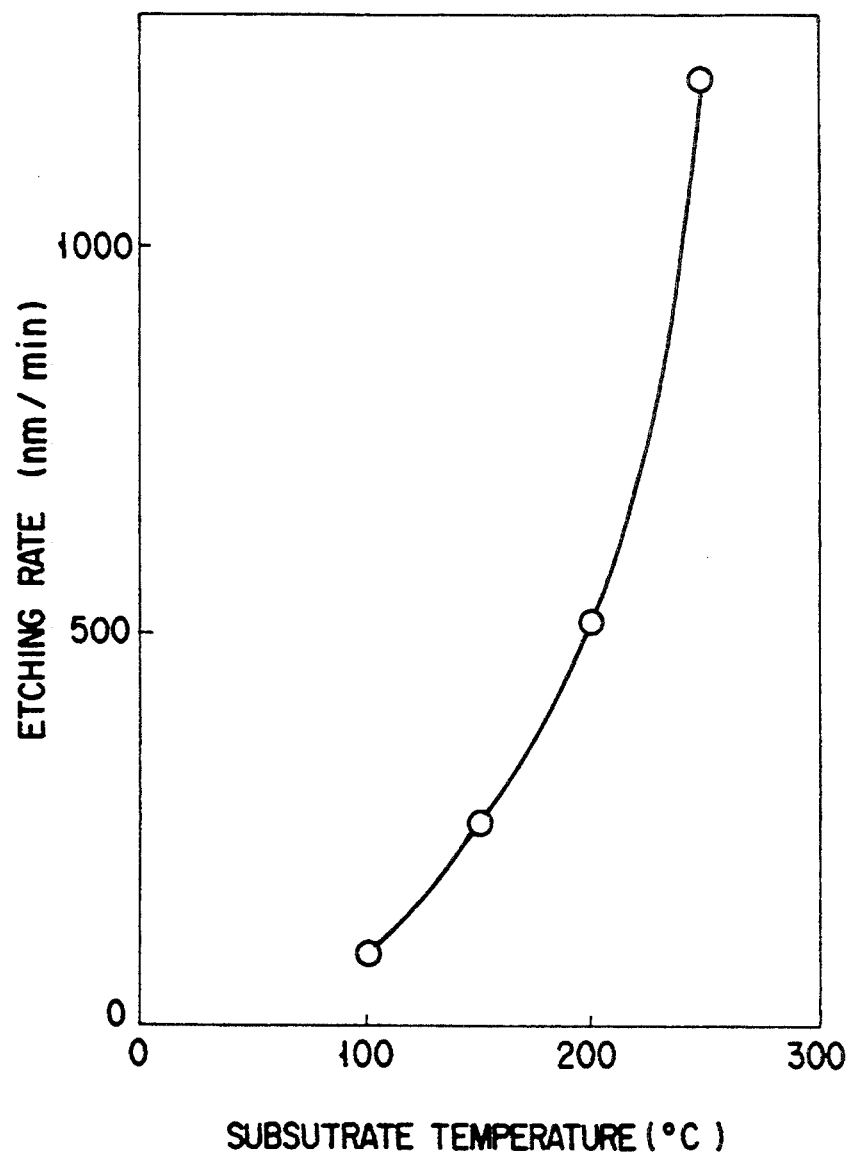
FIGS. 28 is a graph showing a relationship between the etching rate of a photoresist pattern and the substrate temperature.

FIG. 28 is a graph showing a relationship between a substrate temperature and the etching rate of the photoresist pattern etched by an $O_2$ radical. According to FIG. 28, the etching rate is increased in accordance with an increase in substrate temperature. It is found that a practical etching rate can be obtained when the substrate temperature is 100° C. Note that the photoresist pattern begins to be etched at about 50° C. In addition, a pressure is equal to the pressure set in Example 12. Therefore, when the substrate temperature is set to be 100° C. or more, the photoresist pattern and the carbon film pattern can be simultaneously removed by down-flow etching using $O_2$ radicals.

As described above, according to Embodiment 12, the same effect, e.g., removal of the carbon film without any damage to an underlying layer, as in Example 12 can be obtained, as a matter of course, and the photoresist pattern and the carbon film pattern can be simultaneously removed. For this reason, the patterning steps can be advantageously simplified.

EXAMPLE 14

Figure 29:
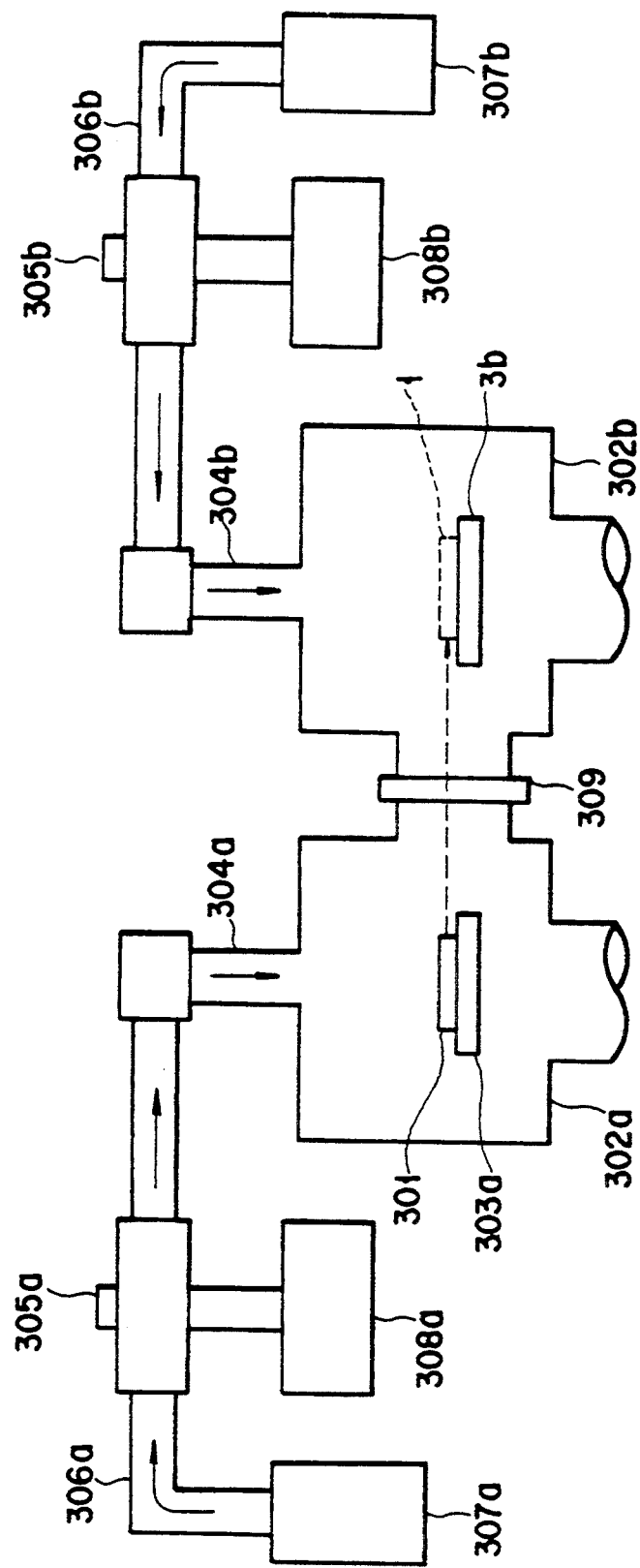
FIG. 29 is a view showing a schematic arrangement of an etching apparatus used in Embodiment 14.

FIG. 29 is a view showing a schematic arrangement of an etching apparatus used in Example 14. This etching device is constituted by connecting two etching apparatuses shown in FIG. 25. That is, in the etching apparatus of Example 14, a reaction chamber 302 a for removing a photoresist pattern and a reaction chamber 302b for removing a carbon film pattern are separately arranged, and they are connected to each other through a gate valve 309.

A method of removing the carbon film pattern and photoresist pattern using the etching apparatus arranged as described above will be described below. The carbon film pattern and photoresist pattern are formed on an Al film to form an Al wiring layer pattern.

A substrate 301 on which the carbon film pattern and photoresist pattern to be removed are formed is loaded in the reaction chamber 302a, and the pressure of the reaction chamber 302a is decreased to a predetermined level, e.g., 0.4 to 0.7 Torr by a gas exhausting portion.

The substrate 301 is heated by a heater 303a to keep a substrate temperature at 50° C. Thereafter, the valve of an etching gas supply portion 307a is opened to flow a gas mixture of a $CF_4$ gas having a flow rate of 50 SCCM and an $O_2$ gas having a flow rate of 500 SCCM into a discharge pipe 305 through a gas supply pipe 306a and to turn on a microwave power supply 308a. As a result, the gas mixture is excited by the discharge pipe 305a, and $CF_4$ and $O_2$ radicals are supplied into the reaction chamber 302a through a gas supply pipe 304a, thereby removing only the photoresist pattern. In this case, only the photoresist pattern is removed because the radicals do not react with the carbon film pattern due to the substrate temperature of 50° C.

After the substrate 301 is moved from the reaction chamber 302a to the reaction chamber 302b in a vacuum state, the substrate 301 is heated to 250° C. By a heater 303b. Thereafter, an $O_2$ gas having a flow rate of 300 SCCM is supplied from an etching gas supply portion 307b to a discharge pipe 305b through a gas supply pipe 306b, and a microwave power supply 308b is turned on to excite the $O_2$ gas. As a result, $O_2$ radicals are supplied into the reaction chamber 302b through a gas supply pipe 304b, and the carbon film pattern is removed by downflow etching using the $O_2$ radicals. In this case, the pressure is kept at a predetermined value, e.g., 0.4 to 0.7 Torr.

In the above method, the same effect as described in the previous embodiments can be obtained, as a matter of course. Since the reaction chamber 302b for removing the carbon film pattern and the reaction chamber 302a for removing the photoresist pattern are separately arranged, an adverse influence by the residual elements of the photoresist pattern can be further decreased. In addition, when an Al wiring layer pattern obtained as described above was examined one week later, any corrosion was not detected on the Al wiring layer pattern.

In this embodiment, although the gas mixture of a $CF_4$ gas and an $O_2$ gas is used as a source gas for radicals to remove the photoresist pattern, a gas mixture of an $O_2$ gas and a source gas such as an $SF_6$ or $NF_3$ gas containing a halogen element may be used as the source gas for a radical as in the previous embodiments. In addition, a gas mixture of a radical containing a halogen element and steam or a gas containing at least hydrogen element may be used in place of the above gas mixture.

In short, a source gas and the substrate temperature are preferably selected not to prevent the carbon film pattern from being etched when the photoresist pattern is removed.

In this embodiment, the substrate temperature in the reaction chamber 302a is set to be 50° C., and the substrate temperature in the reaction chamber 302a is set to be 250° C. However, when the temperatures range from 20° to 100° C. and from 100° to 500° C., respectively, the same effect as described above can be obtained.

The present invention is not limited to the embodiments described in Examples 12 to 14. For example, in the embodiments, a carbon film and a metal film are simultaneously removed using a photoresist pattern as a mask. However, after the carbon film is patterned, the photoresist may be patterned, and the metal film may be etched.

In the above embodiments, although oxygen radicals are used for removing a carbon film, even when a radical such as a hydrogen radical and a fluorine radical is used in place of the oxygen radical, the same effect as described above can be obtained.

In the above embodiments, although a metal film is used as a film to be processed, the present invention can be applied to another film to be processed such as an insulating film and a semiconducting film.

In addition, in the above embodiments, although the removal of a carbon film pattern in the step of patterning a film to be processed has been described, the present invention can be applied to the removal of a carbon film in another step.

Various modifications of the present invention can be effective without departing from the spirit and scope of the invention.

As has been described above, according to Examples 12 to 14, a carbon film can be removed without any damage to the underlying layer of a film to be processed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dry-etching method comprising the steps of:
   forming a carbon thin film on a substrate to be etched;
   forming a resist pattern on said carbon thin film;
   selectively etching said carbon film using said resist pattern as a mask by a plasma of a gas mixture of a gas containing fluorine atoms and a gas containing oxygen atoms so as to form a carbon film pattern; and
   selectively etching said substrate to be etched using said carbon film pattern as a mask or said resist pattern and said carbon film pattern as masks.

2. A method according to claim 1, wherein the gas containing fluorine atoms is at least one selected from the group consisting of $CF_4$, $CHF_3$, $SF_6$, $NF_3$, $C_2F_6$, $C_3F_8$, $BF_3$, $XeF_2$ and $F_2$.

3. A method according to claim 1, wherein the gas containing oxygen atoms is at least one selected from the group consisting of $O_2$, $O_3$, and $CO$.

4. A method according to claim 1, wherein the gas containing fluorine atoms is a gas mixture of a first gas containing hydrogen atoms and a second gas containing fluorine atoms and not containing hydrogen atoms.

5. A method according to claim 1, wherein said first gas further contains fluorine atoms.

6. A method according to claim 5, wherein said first gas further contains carbon atoms.

7. A method according to claim 6, wherein said first gas is $CHF_3$ gas.

8. A method according to claim 4, wherein said second gas further contains carbon atoms.

9. A method according to claim 8, wherein said second gas is a $CF_4$ gas.

10. A method according to claim 1, wherein said substrate to be etched comprises a silicon substrate, an insulating layer formed on the silicon substrate, and a conductive layer formed on the insulating layer, and a wiring pattern is formed by selectively etching said conductive layer using said carbon film pattern as a mask or said resist pattern and said carbon film pattern as masks.

11. A method according to claim 1, wherein said substrate to be etched comprises a silicon substrate, and an insulating layer formed on the silicon substrate, and a contact hole is formed by selectively etching said insulating layer using said carbon film pattern as as mask or said resist pattern and said carbon film pattern as masks.

12. A method according to claim 1, wherein said substrate to be etched is at least one selected from the group consisting of an AlSiCu alloy film, an $SiO_2$ film, a SiN film, a polycrystalline silicon film, a W film, a Cu film, a TiN film, a Ti film, a $Ta_2O_5$ film, a $Nb_2O_5$ film, a $SrTiO_3$ film and a $BaTiO_3$ film.

13. A method according to claim 1, further comprising the steps of: heating said carbon film pattern; and removing said carbon film pattern by oxygen radicals.

14. A method according to claim 13, wherein said carbon film pattern is heated to a temperature of 100° to 500° C.

15. A method according to claim 13, wherein said carbon film pattern is heated to a temperature of 100° to 300° C.

16. A method according to claim 13 wherein the oxygen radicals are formed by applying a high-frequency wave to a gas containing oxygen atoms.

17. A method according to claim 16, wherein the gas containing oxygen atoms is at least one selected from the group consisting of $O_2$, $O_3$ and $CO$.

18. A method according to claim 16, wherein the gas containing oxygen atoms is a gas mixture of $O_2$ and at least one selected from the group consisting of $CF_4$, $CHF_3$, $SF_6$, $NF_3$, $C_2F_6$, $C_3F_8$, $BF_3$, $XeF_2$ and $F_2$.

* * * * *